United States Patent
Miyashita et al.

(10) Patent No.: US 12,065,736 B2
(45) Date of Patent: *Aug. 20, 2024

(54) CLEANING METHOD, METHOD OF MANUFACTURING SEMICONDUCTOR DEVICE, AND SUBSTRATE PROCESSING APPARATUS

(71) Applicant: Kokusai Electric Corporation, Tokyo (JP)

(72) Inventors: Naoya Miyashita, Toyama (JP); Koei Kuribayashi, Toyama (JP); Tomoshi Taniyama, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/323,092

(22) Filed: May 24, 2023

(65) Prior Publication Data

US 2023/0313371 A1    Oct. 5, 2023

Related U.S. Application Data

(63) Continuation of application No. 16/999,345, filed on Aug. 21, 2020, now Pat. No. 11,788,188, which is a
(Continued)

(30) Foreign Application Priority Data

Feb. 23, 2018   (JP) ................................. 2018-031234

(51) Int. Cl.
   *C23C 16/44*   (2006.01)
   *B08B 9/00*    (2006.01)
   (Continued)

(52) U.S. Cl.
   CPC .......... *C23C 16/45525* (2013.01); *B08B 9/00* (2013.01); *C23C 16/308* (2013.01);
   (Continued)

(58) Field of Classification Search
   CPC ............ C23C 16/45525; C23C 16/308; C23C 16/345; C23C 16/347; C23C 16/36;
   (Continued)

(56) References Cited

U.S. PATENT DOCUMENTS

| | | |
|---|---|---|
| 2015/0376781 A1 | 12/2015 | Kogura et al. |
| 2018/0044794 A1 | 2/2018 | Yamaguchi et al. |
| 2021/0087678 A1* | 3/2021 | Ebata ................ C23C 16/45502 |

FOREIGN PATENT DOCUMENTS

JP    2016-012701 A    1/2016

OTHER PUBLICATIONS

International Search Report, PCT/JP2018/048482, Feb. 12, 2019, 2 pgs.

* cited by examiner

*Primary Examiner* — Sharidan Carrillo
(74) *Attorney, Agent, or Firm* — Volpe Koenig

(57) ABSTRACT

There is provided a technique that includes: removing a deposit adhering to an inside of a process container by supplying a cleaning gas into the process container after performing a process of forming a film on a substrate in the process container, wherein the act of removing the deposit includes sequentially and repeatedly performing: a first process of supplying the cleaning gas into the process container until a predetermined first pressure is reached in the process container; a second process of stopping the supply of the cleaning gas and exhausting the cleaning gas and a reaction product generated by the cleaning gas remaining in the process container; and a third process of cooling an exhaust pipe that connects the process container and a
(Continued)

vacuum pump, while maintaining a pressure inside the process container at a second pressure, which is lower than the first pressure, or lower.

15 Claims, 7 Drawing Sheets

Related U.S. Application Data continuation of application No. PCT/JP2018/048482, filed on Dec. 28, 2018.

(51) Int. Cl.
    *C23C 16/30*     (2006.01)
    *C23C 16/34*     (2006.01)
    *C23C 16/36*     (2006.01)
    *C23C 16/455*     (2006.01)
    *H01L 21/02*     (2006.01)

(52) U.S. Cl.
    CPC .......... *C23C 16/345* (2013.01); *C23C 16/347* (2013.01); *C23C 16/36* (2013.01); *C23C 16/4405* (2013.01); *C23C 16/4412* (2013.01); *H01L 21/02126* (2013.01)

(58) Field of Classification Search
    CPC ... C23C 16/4405; C23C 16/4412; B08B 9/00; H01L 21/02126
    See application file for complete search history.

CLEANING METHOD, METHOD OF MANUFACTURING SEMICONDUCTOR DEVICE, AND SUBSTRATE PROCESSING APPARATUS

CROSS-REFERENCE TO RELATED APPLICATION

This application is a Continuation Application of U.S. application Ser. No. 16/999,345, filed Aug. 21, 2020, now U.S. Pat. No. 11,788,188, which is a Bypass Continuation Application of PCT International Application No. PCT/JP2018/048482, filed Dec. 28, 2018, which claims priority to Japanese Application No. 2018-031234, filed Feb. 23, 2018, the disclosure of which is incorporated herein in its entirety by reference.

TECHNICAL FIELD

The present disclosure relates to a cleaning method, a method of manufacturing a semiconductor device, and a substrate processing apparatus.

BACKGROUND

In the related art, as a process of manufacturing a semiconductor device or an integrated circuit (hereinafter referred to as an electronic device or the like), a film-forming process for forming a film on a substrate is often performed by supplying a precursor gas and a reaction gas to the substrate in a process chamber. When the film-forming process is performed, deposits may adhere to an inside of the process chamber. Thus, there is known a cleaning method that, after performing a film-forming process, alternately repeats a step of cleaning an inside of a process chamber in which a substrate is processed by supplying a cleaning gas into the process chamber and exhausting the cleaning gas in the process chamber through an exhaust pipe and a step of cooling the exhaust pipe by maintaining a state where a flow of the cleaning gas into the exhaust pipe is substantially stopped.

When the above-described cleaning process is performed, a waiting time for cooling is generated in each step of cooling the exhaust pipe. Therefore, the cleaning process may be time-consuming.

SUMMARY

Some embodiments of the present disclosure provide a technique capable of improving a manufacturing throughput of an electronic device or the like.

According to one embodiment of the present disclosure, there is provided a technique that includes: removing a deposit adhering to an inside of a process container by supplying a cleaning gas into the process container after performing a process of forming a film on a substrate in the process container, wherein the act of removing the deposit includes sequentially and repeatedly performing: a first process of supplying the cleaning gas into the process container until a predetermined first pressure is reached in the process container; a second process of stopping the supply of the cleaning gas and exhausting the cleaning gas and a reaction product generated by the cleaning gas remaining in the process container; and a third process of cooling an exhaust pipe that connects the process container and a vacuum pump, while maintaining a pressure inside the process container at a second pressure, which is lower than the first pressure, or lower, wherein the third process continuously performs the act of cooling the exhaust pipe until a temperature of the exhaust pipe becomes equal to or lower than a first temperature, when the temperature of the exhaust pipe at the time of transition from the second process to the third process is higher than a second temperature that is higher than the first temperature, and wherein the third process terminates the act of cooling the exhaust pipe at a predetermined time without continuing the act of cooling the exhaust pipe until the temperature of the exhaust pipe becomes equal to or lower than the first temperature, when the temperature of the exhaust pipe is equal to or lower than the second temperature.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments

In addition to shortening time for each cleaning performed every plural times of performing a film formation, a cleaning cycle may be extended to improve a manufacturing throughput of an electronic device or the like. It may be effective to prevent a residue of cleaning from being accumulated to achieve the foregoing. Hereinafter, embodiments of the present disclosure will be described with reference to FIGS. 1 to 7.

(1) Configuration of Substrate Processing Apparatus

Figure 1:
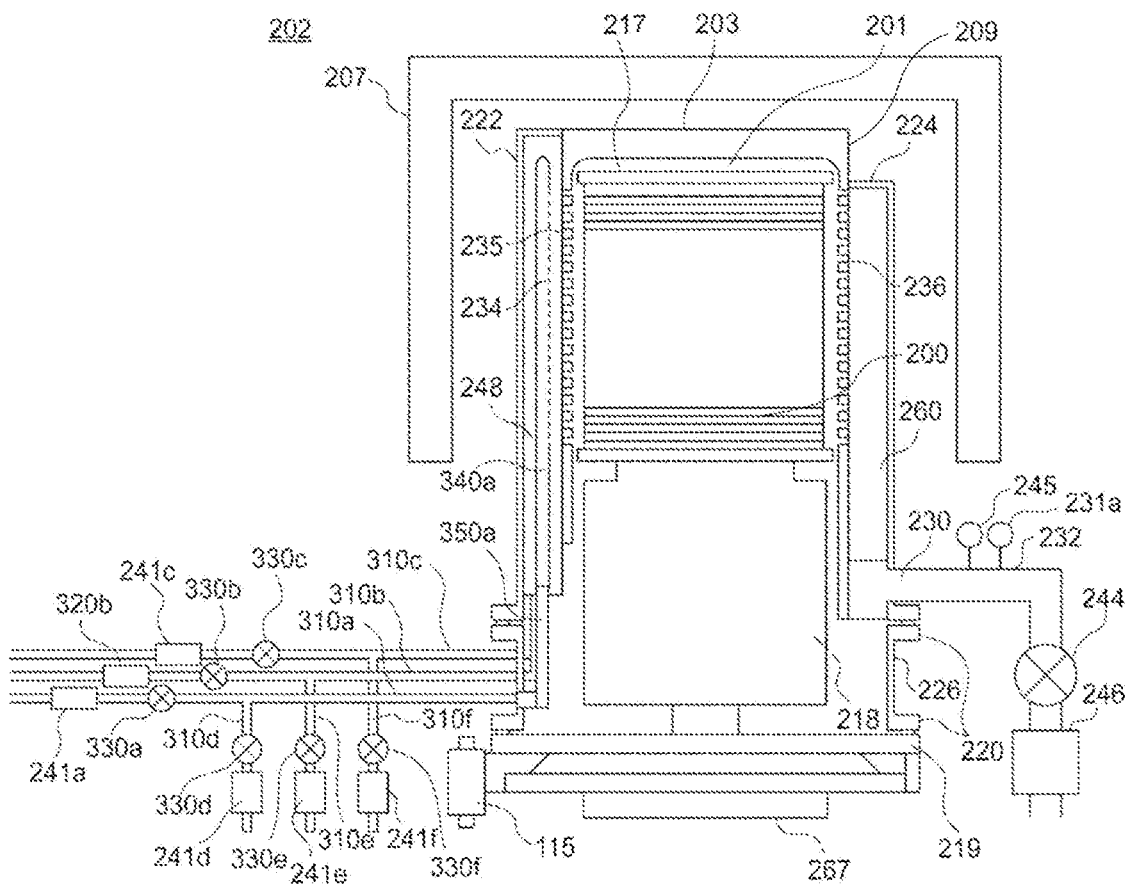
FIG. 1 is a vertical cross-sectional view schematically showing an example of a substrate processing apparatus suitably used in an embodiment of the present disclosure.

As shown in FIG. 1, a process furnace 202 includes a heater 207 as a heating means (heating mechanism). The heater 207 has a cylindrical shape and is vertically installed by being supported by a heater base (not shown) as a holding plate. The heater 207 also functions as an activation mechanism (excitation part) that thermally activates (excites) a gas as described below.

Inside the heater 207, a reaction tube 203 that constitutes a reaction container (process container) is arranged concentrically with the heater 207. The reaction tube 203 is made of, for example, a heat-resistant material such as quartz ($SiO_2$) or silicon carbide (SiC) and is formed to have a ceiling with a lower end portion thereof opened and an upper end portion thereof closed by a flat wall body. A side surface of the reaction tube 203 includes a cylindrical portion 209 formed in a cylindrical shape, a supply buffer 222 as a gas supply area and an exhaust buffer 224 as a gas exhaust area, which are provided at an outer wall of the cylindrical portion 209. A process chamber 201 is formed inside the cylindrical portion 209 of the reaction tube 203. The process chamber 201 is configured to be capable of processing wafers 200 as substrates. Further, the process chamber 201 is configured to be capable of accommodating a boat 217 that can hold the wafers 200 in a horizontal posture in a state in which they are arranged in multiple stages along an axial direction (that is, in a vertical direction) of the reaction tube 203.

The supply buffer 222 is formed so that a convex portion protrudes outward from one side surface of the cylindrical portion 209. An outer wall of the supply buffer 222 is a part of an outer wall of the reaction tube 203 and has a diameter larger than an outer diameter of the cylindrical portion 209. The outer wall of the supply buffer 222 is formed in a circular arc shape concentrically with the cylindrical portion 209. The supply buffer 222 is formed to have a ceiling with a lower end portion thereof opened and an upper end portion thereof closed by a flat wall body. The supply buffer 222 may serve as one or more of a space that accommodates nozzles 340a to 340c described below, a duct that allows a gas to flow therethrough, a buffer that regulates a pressure to make a supply amount spatially uniform, and a preheater configured to cause a thermal decomposition reaction of a gas to occur at an appropriate location. A gas supply slit (supply hole) 235 configured to introduce a gas from a nozzle 340a into the cylindrical portion 209 is formed at a boundary wall 252 which is a wall that constitutes a boundary between the supply buffer 222 and the inside of the cylindrical portion 209. The boundary wall 252 is a part of the original cylindrical shape of the cylindrical portion 209, and an outer surface thereof constitutes a side surface portion facing the supply buffer 222.

The exhaust buffer 224 is formed on the other side surface of the cylindrical portion 209 opposite to the one side surface on which the supply buffer 222 is formed. The exhaust buffer 224 is arranged to sandwich a region of the process chamber 201 in which the wafers 200 are accommodated, between the exhaust buffer 224 and the supply buffer 222. The exhaust buffer 224 is formed on the side surface of the cylindrical portion 209, at a location opposite to the side where the supply buffer 222 is formed, to protrude outward. An outer wall of the exhaust buffer 224 is a part of the outer wall of the reaction tube 203 and has a diameter larger than the outer diameter of the cylindrical portion 209. The outer wall of the exhaust buffer 224 is formed concentrically with the cylindrical portion 209. The exhaust buffer 224 is formed to have a ceiling with a lower end portion and an upper end portion thereof closed by flat wall bodies. An exhaust buffer slit (exhaust hole) 236 is formed at a boundary wall 254, which is a wall body that constitutes a boundary between the exhaust buffer 224 and the inside of the cylindrical portion 209, to bring them into communication with each other. The boundary wall 254 is a part of the cylindrical portion 209, and the outer side surface thereof constitutes a side surface portion facing the exhaust buffer 224. As an example, the supply buffer 222 and the exhaust buffer 224 may be configured such that their internal shapes are substantially the same.

The lower end of the reaction tube 203 is supported by a cylindrical manifold 226. The manifold 226 is made of, for example, a metal such as nickel alloy or stainless steel, or is made of a heat-resistant material such as quartz ($SiO_2$) or silicon carbide (SiC). A flange is formed at an upper end portion of the manifold 226, and the lower end of the reaction tube 203 is installed and supported on the flange. An airtight member 220 such as an O-ring or the like is interposed between the flange and the lower end portion of the reaction tube 203 to keep the inside of the reaction tube 203 airtight.

A seal cap 219 is airtightly attached to a lower end opening of the manifold 226 via the airtight member 220 such as the O-ring or the like. The seal cap 219 is configured to airtightly close the lower end opening of the reaction tube 203, that is, the opening of the manifold 226. The seal cap 219 is made of, for example, a metal such as nickel alloy or stainless steel, and is formed in a disc shape. The seal cap 219 may be configured so that the outside thereof is covered with a heat-resistant material such as quartz ($SiO_2$) or silicon carbide (SiC).

A boat support base 218 that supports the boat 217 is installed on the seal cap 219. The boat support base 218 is made of, for example, a heat-resistant material such as quartz or silicon carbide. The boat support base 218 functions as a heat insulating portion and serves as a support body that supports the boat 217. The boat 217 is installed upright on the boat support base 218.

The boat 217 is made of, for example, a heat-resistant material such as quartz or silicon carbide. The boat 217 includes a bottom plate (not shown) fixed to the boat support base and a top plate (not shown) arranged above the bottom plate. The boat 217 has a configuration in which a plurality of columns are installed between the bottom plate and the top plate. The boat 217 holds a plurality of wafers 200. The wafers 200 are stacked in such a state that the wafers 200 are arranged in a horizontal posture with a certain distance being kept from one another in multiple stages along the axial direction of the reaction tube 203 with centers of the wafers 200 aligned with one another and are supported by the columns of the boat 217.

A boat rotation mechanism 267 that rotates the boat is installed at the opposite side of the seal cap 219 from the process chamber 201. The rotation shaft 265 of the boat rotation mechanism 267 is connected to the boat support base 218 through the seal cap 219. The boat rotation mechanism 267 rotates the boat 217 via the boat support base 218 to rotate the wafers 200.

The seal cap 219 is vertically moved up or down by a boat elevator 115 as an elevating mechanism installed outside the reaction tube 203, whereby the boat 217 can be loaded into or unloaded from the process chamber 201.

Nozzle support portions 350a to 350c that support nozzles 340a to 340c are installed at the manifold 226 to be bent in an L shape and penetrate the manifold 226. In the present embodiment three nozzle support portions 350a to 350c are installed. The nozzle support portions 350a to 350c are made of, for example, a material such as nickel alloy or stainless steel. Gas supply pipes 310a to 310c that supply gases into the reaction tube 203 are connected to one ends of the nozzle support portions 350a to 350c on the side of the reaction tube 203, respectively. Nozzles 340a to 340c are connected to the other ends of the nozzle support portions 350a to 350c, respectively. The nozzles 340a to 340c are made of, for example, a heat-resistant material such as quartz or SiC.

As an example, the nozzles 340a to 340c are installed to extend from a lower side to an upper side in the supply buffer 222 along a length direction (vertical direction) thereof. The nozzles 340a to 340c have gas supply holes 232a to 232c configured to discharge gases respectively. At least one of the gas supply holes 232a to 232c may be formed in the same number as the exhaust buffer slits 236 such that each of the holes faces the center of the reaction tube 203. As described above, the three nozzles 340a to 340c are installed in the supply buffer 222 and configured to be capable of supplying plural types of gases into the process chamber 201.

In the process furnace 202 described above, the boat 217 is inserted into the process chamber 201 while being supported by the boat support base 218 in a state in which a plurality of wafers 200 to be batch-processed is stacked in multiple stages on the boat 217, and the heater 207 is configured to heat the wafers 200 inserted in the process chamber 201 to a predetermined temperature.

At the gas supply pipe 310a, a first processing gas supply source (not shown) configured to supply a first processing gas, a mass flow controller (MFC) 241a, which is a flow rate controller (flow rate control part), and a valve 330a, which is an opening/closing valve, are installed in this order from an upstream side. At the gas supply pipe 310b, a second processing gas supply source (not shown) configured to supply a second processing gas, a mass flow controller (MFC) 241b, which is a flow rate controller, and a valve 330b, which is an opening/closing valve, are installed in this order from an upstream side. At the gas supply pipe 310c, a third processing gas supply source (not shown) configured to supply a third processing gas, a mass flow controller (MFC) 241c, which is a flow rate controller, and a valve 330c which is an opening/closing valve, are installed in this order from an upstream side. A gas supply pipe 310d configured to supply an inert gas and gas supply pipes 310e and 310f configured to supply a cleaning gas are connected to the gas supply pipes 310a to 310c on the downstream side of the valves 330a to 330c, respectively. At the gas supply pipes 310d to 310f, a fourth processing gas supply source (not shown) to a sixth processing gas supply source (not shown) configured to supply a fourth processing gas to a sixth processing gas, MFCs 241d to 241f, which are flow rate controllers (flow rate control parts), and valves 330d to 330f, which are opening/closing valves, are installed in this order from an upstream side.

A first processing gas supply system mainly includes the gas supply pipe 310a, the MFC 320a and the valve 330a. The first processing gas supply source, the nozzle support portion 350a and the nozzle 340a may be included in the first processing gas supply system. In addition, a second processing gas supply system mainly includes the gas supply pipe 310b, the MFC 320b and the valve 330b. The second processing gas supply source, the nozzle support portion 350b and the nozzle 340b may be included in the second processing gas supply system. In addition, a third processing gas supply system mainly includes the gas supply pipe 310c, the MFC 320c and the valve 330c. The third processing gas supply source, the nozzle support portion 350c and the nozzle 340c may be included in the third processing gas supply system.

Further, a fourth processing gas supply system mainly includes the gas supply pipe 310d, the MFC 320d and the valve 330d. The fourth processing gas supply source, the nozzle support portion 350a and the nozzle 340a may be included in the fourth processing gas supply system. In addition, a fifth processing gas supply system mainly includes the gas supply pipe 310e, the MFC 320e and the valve 330e. The fifth processing gas supply source, the nozzle support portion 350b and the nozzle 340b may be included in the fifth processing gas supply system. Further, a sixth processing gas supply system mainly includes the gas supply pipe 310f, the MFC 320f and the valve 330f. The sixth processing gas supply source, the nozzle support portion 350c and the nozzle 340c may be included in the sixth processing gas supply system.

When the term "processing gas" is used herein, it may include only the first processing gas, only the second processing gas, only the third processing gas, or all of them. Further, when the term "processing gas supply system" is used, it may include only the first processing gas supply system, only the second processing gas supply system, only the third processing gas supply system, or all of them.

A precursor gas containing a predetermined element, for example, a halosilane precursor gas containing Si as the predetermined element and a halogen element, is supplied from the first processing gas supply source.

The halosilane precursor gas refers to a halosilane precursor in a gaseous state, for example, a gas obtained by vaporizing a halosilane precursor staying in a liquid state at the room temperature and the atmospheric pressure, a halosilane precursor staying in a gaseous state at the room temperature and the atmospheric pressure, and the like. The halosilane precursor refers to a silane precursor containing a halogen group. The halogen group includes a chloro group, a fluoro group, a bromo group, an iodo group and the like. That is, the halogen group includes halogen elements such as chlorine (Cl), fluorine (F), bromine (Br), iodine (I) and the like. It can be said that the halosilane precursor is a kind of halide. When the term "precursor" is used herein, it may mean "a liquid precursor staying in a liquid state", "a precursor gas staying in a gaseous state", or both.

As the halosilane precursor gas, it may be possible to use, for example, a precursor gas containing Si and Cl, that is, a chlorosilane precursor gas. As the chlorosilane precursor gas, it may be possible to use, for example, a hexachlorodisilane ($Si_2Cl_6$, abbreviation: HCDS) gas. HCDS does not contain a hydrogen element in its composition. When using a liquid precursor such as HCDS or the like staying in a liquid state at the room temperature and the atmospheric pressure, the liquid precursor is vaporized by a vaporization system such as a vaporizer or a bubbler and supplied as a precursor gas (HCDS gas).

From the second processing gas supply source, for example, a carbon (C)-containing gas is supplied as a reaction gas having a chemical structure (molecular structure) different from that of the precursor gas. As the carbon-containing gas, it may be possible to use, for example, a hydrocarbon-based gas. It can be said that the hydrocarbon-based gas is a substance composed of only two elements, C and H, and acts as a C source in a substrate processing process described below. As the hydrocarbon-based gas, it may be possible to use, for example, a propylene ($C_3H_6$) gas.

From the second processing gas supply source, for example, an oxygen (O)-containing gas is supplied as a reaction gas having a chemical structure different from that of the precursor gas. The oxygen-containing gas acts as an oxidizing gas, that is, an O source, in the substrate processing process described later. As the oxygen-containing gas, it may be possible to use, for example, an oxygen ($O_2$) gas.

From the second processing gas supply source, for example, a boron (B)-containing gas such as borane or the like may be supplied as a reaction gas having a chemical structure different from that of the precursor gas.

From the third processing gas supply source, for example, a nitrogen (N)-containing gas is supplied as a reaction gas having a chemical structure different from that of the precursor gas. As the nitrogen-containing gas, it may be possible to use, for example, a hydrogen nitride-based gas such as an ammonia ($NH_3$) gas or the like. The hydrogen nitride-based gas acts as a nitriding gas, that is, an N source in the substrate processing process described below.

From the fourth processing gas supply source, a fluorine-based gas is supplied as a cleaning gas. As the fluorine-based gas, it may be possible to use, for example, a fluorine ($F_2$) gas.

From the fifth processing gas supply source, a reaction promoting gas that promotes an etching reaction caused by the above-mentioned fluorine-based gas is supplied as a cleaning gas. As the reaction promoting gas, it may be possible to use, for example, a nitric oxide (NO) gas.

From the sixth processing gas supply source, for example, a nitrogen ($N_2$) gas is supplied as an inert gas. The connection among the first to sixth process gas supply sources and the nozzles 340a to 340c is not limited to the above-described method, and may be performed in various combinations. For example, the purge gas may be supplied to all nozzles, and the fluorine gas and the NO gas may be mixed with each other in advance and supplied to one nozzle.

An exhaust port (or a connector) 230 is provided below the gas exhaust area 224. The exhaust port 230 is connected to the exhaust pipe 232 in fluid communication. A vacuum pump 246 as an vacuum-evacuation device is connected to the exhaust pipe 232 via a pressure sensor 245 as a pressure detector configured to detect the pressure in the process chamber 201 and an APC (Auto Pressure Controller) valve 244 as a pressure regulator. The process chamber 201 is configured to be evacuated such that a pressure in the process chamber 201 becomes a predetermined pressure (degree of vacuum). The exhaust pipe 232 on a downstream side of the vacuum pump 246 is connected to a waste gas treatment device (not shown) or the like. The APC valve 244 is an opening/closing valve that can be opened or closed to evacuate the inside of the process chamber 201 or to stop the evacuation of the inside of the process chamber 201. Further, a valve opening degree (a conductance) of the APC valve 244 can be adjusted to control an exhaust speed and to regulate the pressure inside the process chamber 201. An exhaust system mainly includes the exhaust pipe 232, the APC valve 244 and the pressure sensor 245. The vacuum pump 246 may also be included in the exhaust system.

A temperature sensor 238 as a temperature detector, which will be described below, is installed in the reaction tube 203. By adjusting the electric power supplied to the heater 207 based on temperature information detected by the temperature sensor 238, a temperature inside the process chamber 201 is controlled to have a desired temperature distribution. Further, a temperature sensor 231a as a temperature detector configured to measure a temperature of the exhaust pipe 232 is disposed in the exhaust pipe 232.

Figure 2:
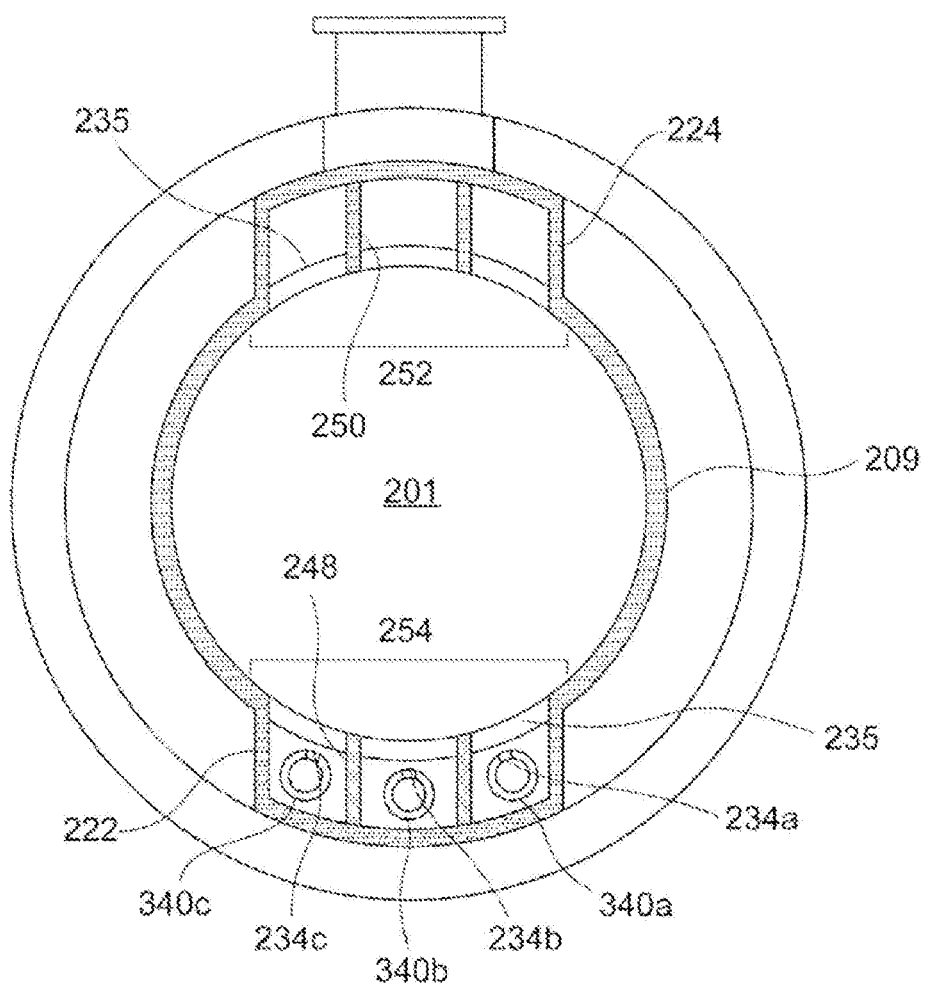
FIG. 2 is a schematic configuration diagram of a part of a substrate processing apparatus suitably used in an embodiment of the present disclosure, which is a horizontal cross-sectional view of a reaction tube.

As shown in FIG. 2, in the gas supply area 222 and the gas exhaust area 224, inner walls 248 and 250 are formed to divide an internal space of each area into a plurality of spaces. The inner walls 248 and 250 are made of the same material as the reaction tube 203, and are made of, for example, a heat-resistant material such as quartz ($SiO_2$) or silicon carbide (SiC). In the present embodiment, each of the gas supply area 222 and the gas exhaust area 224 has two inner walls and is divided into three spaces.

The two inner walls 248 that partition the inside of the supply buffer 222 are provided to partition the supply buffer 222 from a lower end side to an upper end side thereof and form three separate spaces. The nozzles 340a to 340c are installed in the respective spaces of the supply buffer 222. Since the nozzles 340a to 340c are respectively installed in independent spaces divided by the inner walls 248, it is possible to prevent the processing gases supplied from the nozzles 340a to 340c from being mixed in the supply buffer 222. According to such a configuration, it is possible to prevent the processing gases from mixing with each other in the supply buffer 222 to form a thin film and prevent by-products from being generated in the supply buffer 222. In some embodiments, the inner walls 248 may be provided divide the supply buffer 222 from the lower end to the upper end thereof and form three spaces which are separated from each other.

The two inner walls 250 that partition the inside of the exhaust buffer 224 are provided to partition the exhaust buffer 224 from the lower end side to the upper end side thereof and form three spaces which are separated from each other. In some embodiments, the inner walls 250 may be provided to partition the gas exhaust area 224 from the upper end thereof to a portion immediately above the exhaust port 230 and form three spaces which are separated from each other.

Although the inner walls 250 may not always be provided for the exhaust, formation of the exhaust buffer 224 in a symmetrical shape with the supply buffer 222 has merits of reducing a manufacturing cost and improving a dimensional accuracy, a mechanical strength and a temperature uniformity.

Figure 3:
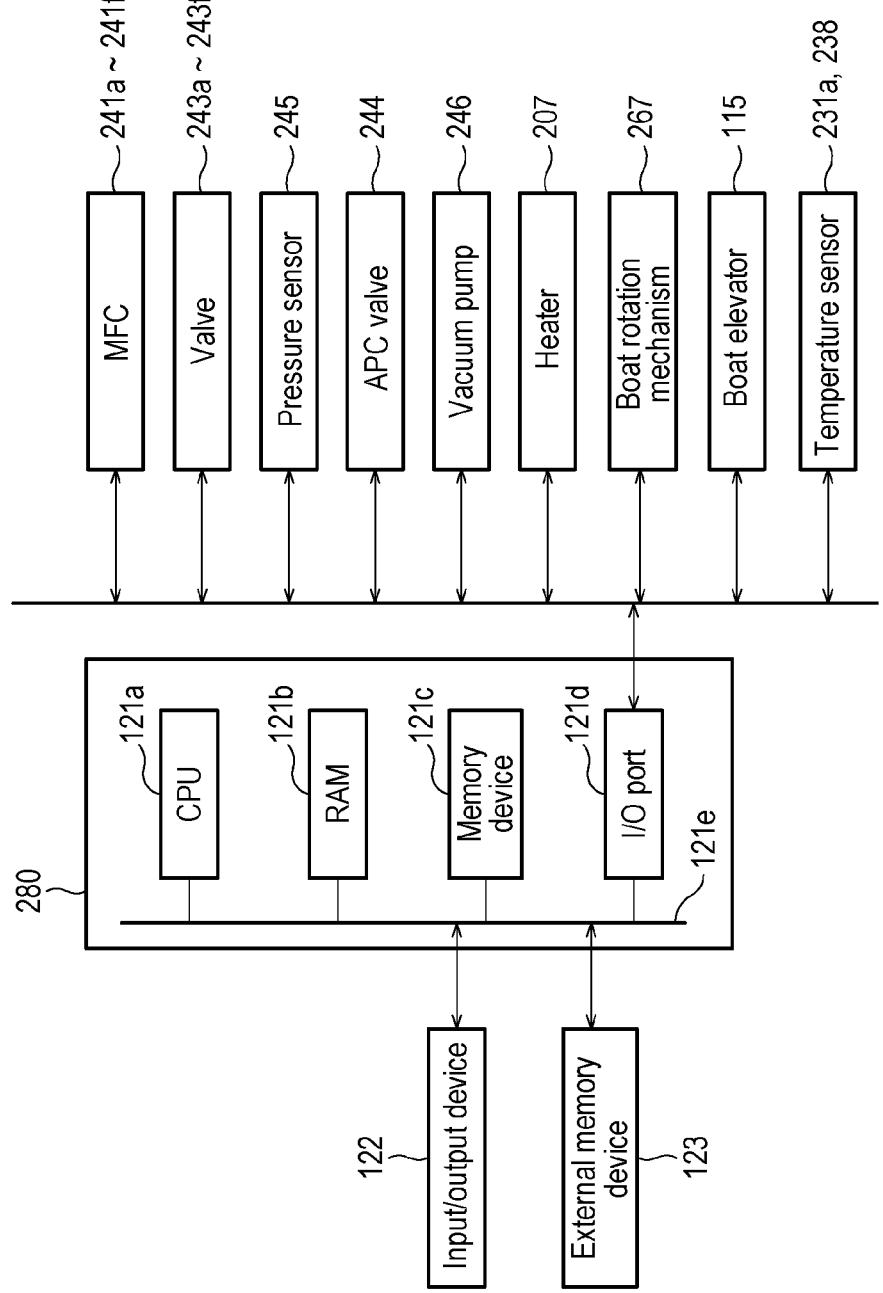
FIG. 3 is a diagram illustrating a control part suitably used in an embodiment of the present disclosure.

As shown in FIG. 3, the controller 280, which is a control part, is configured as a computer including a CPU (Central Processing Unit) 121a, a RAM (Random Access Memory) 121b, a memory device 121c and an I/O port 121d. The RAM 121b, the memory device 121c and the I/O port 121d are configured to be capable of exchanging data with the CPU 121a via an internal bus 121e. An input/output device 122 configured as, for example, a touch panel or the like is connected to the controller 280.

The memory device 121c includes, for example, a flash memory, an HDD (Hard Disk Drive), or the like. In the memory device 121c, a control program that controls an operation of the substrate processing apparatus, a process recipe in which the procedures and conditions of the substrate processing process described below are written, and the like are readably stored. The process recipe is a combination that allows the controller 280 to execute each procedure in the substrate processing process described below to obtain a predetermined result. The process recipe functions as a program. Hereinafter, the process recipe, the control program and the like are collectively and simply referred to as a program. When the term "program" is used herein, it may include only the process recipe, only the control program, or both. The RAM 121b is configured as a memory area (work area) in which the program read by the CPU 121a, data and the like are temporarily stored.

The I/O port 121d is connected to the MFCs 241a to 241f, the valves 330a to 330f, the pressure sensor 245, the APC valve 244, the vacuum pump 246, the heater 207, the temperature sensors 231a and 238, the boat rotation mechanism 267, the boat elevator 115, and the like.

The CPU 121a is configured to read the control program from the memory device 121c and execute the control program thus read, and is configured to read the process recipe from the memory device 121c in response to the input of an operation command from the input/output device 122. The CPU 121a is configured to control, according to the contents of the read process recipe, the flow rate adjustment operation of various gases by the MFCs 241a to 241f, the opening/closing operations of the valves 330a to 330f, the opening/closing operation of the APC valve 244, the pressure regulation operation by the APC valve 244 based on the pressure sensor 245, the startup and stop of the vacuum pump 246, the temperature adjustment operation of the heater 207 based on the temperature sensor 238, the rotation and rotation speed adjustment operation of the boat 217 by the boat rotation mechanism 267, the raising/lowering operation of the boat 217 by the boat elevator 115, and the like.

The controller 280 is not limited to being configured as a dedicated computer, but may be configured as a general-purpose computer. For example, the controller 280 of the present embodiment may be configured by providing an external storage device (for example, a magnetic tape, a magnetic disk such as a flexible disk or a hard disk, an optical disk such as a CD or a DVD, a magneto-optical disk such as an MO or the like, a semiconductor memory such as a USB memory or a memory card, etc.) 123 that stores the aforementioned program, and installing the program in a general-purpose computer through the use of the external memory device 123. However, the means for supplying the program to the computer is not limited to the case where the program is supplied via the external storage device 123. For example, the program may be supplied through the use of communication means such as the Internet or a dedicated line without having to use the external memory device 123. The memory device 121c and the external memory device 123 are configured as a computer-readable recording medium. Hereinafter, these are collectively and simply referred to as a recording medium. When the term "recording medium" is used herein, it may include only the memory device 121c, only the external memory device 123, or both.

(2) Film-Forming Process

As one of processes of manufacturing a semiconductor device by using the above-described substrate processing apparatus, a sequence example of forming a film on a substrate will be described with reference to FIG. 4. In the following description, operations of the respective parts of the substrate processing apparatus are controlled by the controller 280.

Figure 4:
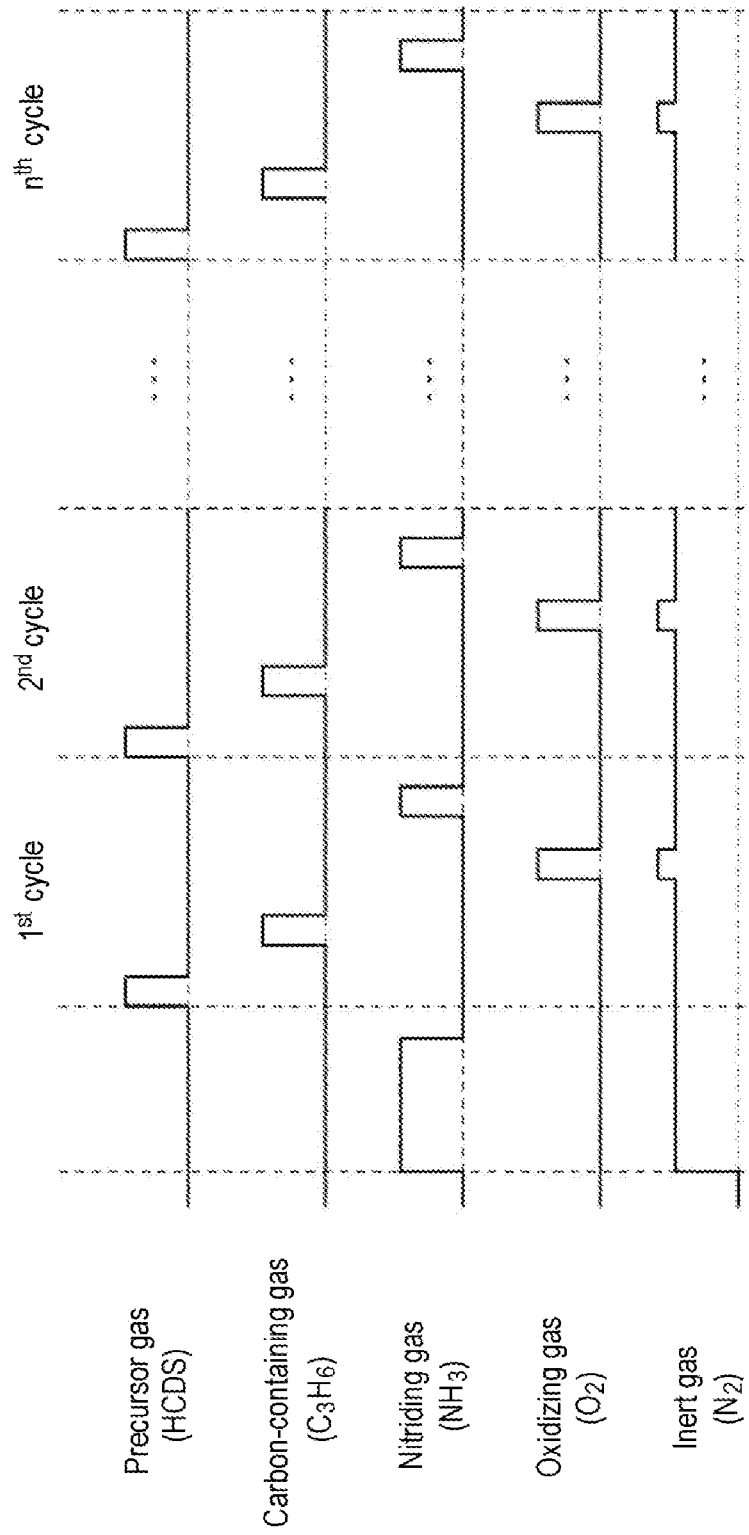
FIG. 4 is a diagram showing gas supply timings in a film-forming sequence according to an embodiment of the present disclosure.

In the film-forming sequence shown in FIG. 4, a silicon oxycarbonitride film (SiOCN film) as a film containing Si, O, C and N is formed on the wafer 200 as the substrate by performing a surface treatment step of pretreating a surface of the wafer 200 by supplying an $NH_3$ gas as a nitriding gas to the wafer 200, and then performing a cycle a predetermined number of times, the cycle including:

step 1 of supplying an HCDS gas as a precursor gas to the wafer 200;

step 2 of supplying a $C_3H_6$ gas as a carbon-containing gas to the wafer 200;

step 3 of supplying an $O_2$ gas as an oxidizing gas to the wafer 200; and step 4 of supplying the $NH_3$ gas as the nitriding gas to the wafer 200.

As an example, a cycle of non-simultaneously and sequentially performing steps 1 to 4 may be performed a predetermined number of times (n times). Alternatively, some of steps 1 to 4 may be performed simultaneously. In the present embodiment, performing the cycle a predetermined number of times means performing the cycle once or a plurality of times.

In the present disclosure, the above-described film formation sequence may be denoted as follows.

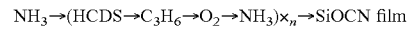

When the word "wafer" is used herein, it may mean "wafer itself" or "a laminated body (aggregate) of a wafer and a predetermined layer or film formed on the surface thereof."

In a case where carbon or oxygen may not be included in a composition, step 2 and step 3 may be omitted. In that case, an $Si_3N_4$ film may be deposited.

Now, an outline of the film-forming process for one batch by using the substrate processing apparatus will be described.

(Wafer Charging and Boat Loading)

When a plurality of wafers 200 is charged to the boat 217 (wafer charging), as shown in FIG. 1, the boat 217 holding the plurality of wafers 200 is lifted by the boat elevator 115 and loaded into the process chamber 201 (boat loading). In this state, the seal cap 219 seals the lower end of the manifold 226 via the O-ring 220b.

(Pressure Regulation and Temperature Adjustment)

An inside of the process chamber 201, that is, a space in which the wafers 200 exist, is vacuum-evacuated (depressurization-evacuated) by the vacuum pump 246 to have a desired pressure (degree of vacuum). At this time, the pressure inside the process chamber 201 is measured by the pressure sensor 245, and the APC valve 244 is feedback-controlled based on the measured pressure information. The vacuum pump 246 is maintained in a constantly operating state at least until the processing on the wafers 200 is completed.

Further, the wafers 200 in the process chamber 201 are heated by the heater 207 to have a desired film-forming temperature. At this time, supply of electric power to the heater 207 is feedback-controlled based on the temperature information detected by the temperature sensor 238 so that the inside of the process chamber 201 has a desired temperature distribution. By heating the wafers 200 in the process chamber 201 to the film-forming temperature, the inner wall of the reaction tube 203, the surface of the boat 217, and the like are heated to the film-forming temperature. The heating of the inside of the process chamber 201 by the heater 207 is continuously performed at least until the processing on the wafers 200 is completed.

Further, the rotation of the boat 217 and the wafers 200 are started by the boat rotation mechanism 267. The rotation of the boat 217 and the wafers 200 by the boat rotation mechanism 267 is continuously performed at least until the processing on the wafers 200 is completed.

(SiOCN Film Formation Step)

Next, a surface modification step described below is performed, and then the following four steps, that is, steps 1 to 4 are sequentially executed.

[Surface Modification Step]

($NH_3$ Gas Supply)

In this step, an $NH_3$ gas is caused to flow into the gas supply pipe 310c, and the valve 330c is opened. The flow rate of the NH₃ gas is adjusted by the MFC 241c. The NH₃ gas is supplied into the process chamber 201 from the nozzle 340c heated to the film-forming temperature, and is exhausted from the exhaust pipe 232. At this time, the wafers 200 are exposed to the NH₃ gas thermally activated. At the same time, the valve 330f is opened e, and an N₂ gas is caused to flow into the gas supply pipe 310f. The N₂ gas flowing through the gas supply pipe 310f together with the NH₃ gas is supplied into the process chamber 201, and is exhausted from the exhaust pipe 232.

At this time, the APC valve 244 is appropriately adjusted so that the pressure in the process chamber 201 is set to a pressure falling within a range of, for example, 1 to 6000 Pa. The supply flow rate of the NH₃ gas controlled by the MFC 241a is set to a flow rate falling within a range of, for example, 100 to 10,000 sccm. The supply flow rate of the N₂ gas controlled by the MFC 241c is set to a flow rate falling within a range of, for example, 100 to 10,000 sccm. A partial pressure of the NH₃ gas in the process chamber 201 is set to a pressure falling within a range of, for example, 0.01 to 5941 Pa. The time for which the NH₃ gas is supplied to the wafers 200, that is, gas supply time (irradiation time) is set to a time falling within a range of, for example, 1 to 600 seconds. The temperature of the heater 207 may be set such that the temperature of the wafers 200 falls within a range of, for example, 250 to 700 degrees C., specifically 300 to 650 degrees C., and more specifically 350 to 600 degrees C. The NH₃ gas is thermally activated under the above conditions. In a case where the NH₃ gas is supplied by thermally activating the same, it is possible to generate a soft reaction and to softly perform a surface modification described below.

By supplying the activated NH₃ gas to an outermost surface of the wafer 200 (a base surface when forming the SiOCN film), the outermost surface of the wafer 200 is modified. As an example of the modification, NH₃ or a precursor may be adsorbed to the outermost surface of the wafer 200, dissociative adsorption may occur, the outermost surface of the wafer 200 may be nitrided, or two or more of them may occur in parallel. The outermost surface of the wafer 200 subjected to the surface modification has a surface state in which HCDS is easily adsorbed and Si is easily deposited in step 1 described below. That is, the NH₃ gas used in the surface modification step acts as an adsorption/deposition promoting gas that promotes adsorption and deposition of HCDS and Si on the outermost surface of the wafer 200.

(Residual Gas Removal)

After the surface modification is completed, the valve 330c is closed and the supply of the NH₃ gas is stopped. At this time, while keeping the APC valve 244 opened, the inside of the process chamber 201 is vacuum-evacuated by the vacuum pump 246, and the NH₃ gas unreacted or contributed to the surface modification, which remains in the process chamber 201, is substantially removed from the inside of the process chamber 201. At this time, the valve 330f is kept opened to maintain the supply of the N₂ gas into the process chamber 201. The N₂ gas acts as a purge gas, which makes it possible to enhance an effect of removing the gas remaining in the process chamber 201 from the process chamber 201.

In this context, the expression "substantially removed" means that the gas remaining in the process chamber 201 may not be completely removed and that the process chamber 201 may not be completely purged. In a case where an amount of the gas remaining in the process chamber 201 is very small, no adverse effect will occur in step 1 performed subsequently. The flow rate of the N₂ gas supplied into the process chamber 201 may not be a large flow rate. For example, by supplying the N₂ gas in an amount similar to a volume of the reaction tube 203 (process chamber 201), it is possible to perform purging to an extent that the adverse effect does not occur in step 2. By not completely purging the inside of the process chamber 201 as described above, purging time can be shortened and consumption of the N₂ gas can be suppressed to a necessary minimum level.

As the nitrogen-containing gas, in addition to the NH₃ gas, it may be possible to use a hydrogen nitride-based gas such as a diazene (N₂H₂) gas, a hydrazine (N₂H₄) gas, an N₃H₈ gas or the like, or a gas containing these compounds. As the inert gas, in addition to the N₂ gas, it may be possible to use, for example, a rare gas such as an Ar gas, a He gas or the like.

[Step 1]
(HCDS Gas Supply)

After the surface modification step is completed, an HCDS gas is supplied to the wafers 200 in the process chamber 201.

In this step, the opening/closing control of the valves 330a and 330f is performed in the same procedure as the opening/closing control of the valves 330c and 330f in the surface modification step. The HCDS gas is supplied into the process chamber 201 through the gas supply pipe 310a and the nozzle 340a heated to the film-forming temperature. The supply flow rate of the HCDS gas controlled by the MFC 241a may be set to a flow rate falling within a range of, for example, 1 to 2000 sccm, and specifically 10 to 1000 sccm. The pressure in the process chamber 201 may be set to a pressure falling within a range of, for example, 1 to 4000 Pa, specifically 67 to 2666 Pa, and more specifically 133 to 1333 Pa. The time for which the HCDS gas is supplied to the wafers 200, that is, the gas supply time (irradiation time) may be set to a time falling within a range of, for example, 1 to 120 seconds, and specifically 1 to 60 seconds. The temperature of the heater 207 may be set such that, as in the surface modification step, the temperature of the wafers 200 falls within a range of, for example, 250 to 700 degrees C., specifically 300 to 650 degrees C., and more specifically 350 to 600 degrees C.

When the temperature of the wafers 200 exceeds 700 degrees C., the CVD reaction becomes too strong (an excessive vapor phase reaction occurs), whereby film thickness uniformity is likely to deteriorate and is difficult to control. By setting the temperature of the wafers 200 to 700 degrees C. or lower, a proper gas phase reaction is caused to occur, whereby the deterioration in the film thickness uniformity can be suppressed and the control thereof can be performed. In particular, by setting the temperature of the wafers 200 to 650 degrees C. or lower, and further to 600 degrees C. or lower, the surface reaction becomes more dominant than the gas phase reaction, whereby the film thickness uniformity can be easily ensured and the control thereof can be facilitated.

Therefore, the temperature of the wafers 200 may be set to a temperature falling within a range of 250 to 700 degrees C., specifically 300 to 650 degrees C., and more specifically 350 to 600 degrees C.

Other processing conditions are, for example, the same as the processing conditions of the surface modification step.

By supplying the HCDS gas to the wafers 200 under the above-described conditions, an Si-containing film containing Cl, which has a thickness of, for example, less than one atomic layer to several atomic layers is formed as a first layer on the outermost surface of the wafer 200. The Si-containing layer containing Cl may be a physical adsorption layer of HCDS, a chemical adsorption layer of HCDS, or both.

When the thickness of the first layer exceeds several atomic layers, the modification action in steps 3 and 4 described below does not reach the entire first layer. Further, a minimum value of the thickness of the first layer is less than one atomic layer. Therefore, the thickness of the first layer may be less than one atomic layer to several atomic layers. Thus, the action of the modification reaction in steps 3 and 4 described below can be relatively enhanced, and the time required for the modification reaction can be shortened. The time required to form the first layer in step 1 can also be shortened. As a result, it is possible to shorten the process time per cycle and to shorten the total process time.

(Residual Gas Removal)

After the first layer is formed, the valve 330*a* is closed and the supply of the HCDS gas is stopped. Then, by a processing procedure similar to the surface modification step, the HCDS gas unreacted or contributed to the formation of the Si-containing layer containing Cl and the reaction by-products, which remain in the process chamber 201, are removed from the process chamber 201. At this time, as in the surface modification step, the gas and the like remaining in the process chamber 201 may not be completely removed.

As the precursor gas, in addition to the HCDS gas, it may be possible to use, for example, an inorganic precursor gas such as a dichlorosilane ($SiH_2Cl_2$, abbreviation: DCS) gas, a monochlorosilane ($SiH_3Cl$, abbreviation: MCS) gas, a tetrachlorosilane, that is, silicon tetrachloride ($SiCl_4$, abbreviation: STC) gas, a trichlorosilane ($SiHCl_3$, abbreviation: TCS) gas, a trisilane ($Si_3H_8$, abbreviation: TS) gas, a disilane ($Si_2H_6$, abbreviation: DS) gas, a monosilane ($SiH_4$, abbreviation: MS) gas or the like, and an organic precursor gas such as a tetrakisdimethylaminosilane ($Si[N(CH_3)_2]_4$, abbreviation: 4DMAS) gas, a trisdimethylaminosilane ($Si[N(CH_3)_2]_3H$, abbreviation: 3DMAS) gas, a bisdiethylaminosilane ($Si[N(C_2H_5)_2]_2H_2$, abbreviation: 2DEAS) gas, a bis-tertiary-butylaminosilane ($SiH_2[NH(C_4H_9)]_2$, abbreviation: BTBAS) gas or the like.

[Step 2]

($C_3H_6$ Gas Supply)

After step 1 is completed, a thermally activated $C_3H_6$ gas is supplied to the wafers 200 in the process chamber 201.

In this step, the opening/closing control of the valves 330*b* and 330*f* is performed in the same procedure as the opening/closing control of the valves 330*c* and 330*f* in the surface modification step. The $C_3H_6$ gas is supplied into the process chamber 201 through the gas supply pipe 310*b* and the nozzle 340*b* heated to the film-forming temperature. The supply flow rate of the $C_3H_6$ gas controlled by the MFC 241*b* is set to a flow rate falling within a range of, for example, 100 to 10,000 sccm. The pressure in the process chamber 201 is set to a pressure falling within a range of, for example, 1 to 6,000 Pa. The partial pressure of the $C_3H_6$ gas in the process chamber 201 is set to a pressure falling within a range of, for example, 0.01 to 5941 Pa. The time for which the $C_3H_6$ gas is supplied to the wafers 200, that is, the gas supply time (irradiation time) may be set to a time falling within a range of, for example, 1 to 200 seconds, specifically 1 to 120 seconds, and more specifically 1 to 60 seconds. Other processing conditions are, for example, the same as the processing conditions in the surface modification step. The $C_3H_6$ gas is thermally activated under the above conditions.

At this time, the HCDS gas is not allowed to flow into the process chamber 201. Therefore, the $C_3H_6$ gas is supplied to the wafers 200 in an activated state without causing a gas phase reaction. As a result, a carbon-containing layer (C-containing layer) is formed on the first layer, that is, the Si-containing layer containing Cl, which has been formed on the wafer 200 in step 1. The C-containing layer may be a C layer, a $C_3H_6$ adsorption layer, or both. The C-containing layer is a layer having a thickness of less than one molecular layer or less than one atomic layer, that is, a discontinuous layer. Thus, a second layer containing Si and C is formed on the outermost surface of the wafer 200. The second layer is a layer that includes an Si-containing layer containing Cl and a C-containing layer.

The C-containing layer needs to be a discontinuous layer. When the surface of the Si-containing layer containing Cl is entirely covered with the C-containing layer, Si does not exist on the surface of the second layer. As a result, the oxidation reaction of the second layer in step 3 described below, or the nitriding reaction of the third layer in step 4 described below may be difficult to occur. This is because N and O are bonded to Si but is not easily bonded to C under the processing conditions described above. I, adsorption state of the C-containing layer on the Si-containing layer containing Cl may be an unsaturated state, and Si may be exposed on the surface of the second layer to cause a desired oxidation reaction or nitriding reaction in step 3 or step 4 described below.

(Residual Gas Removal)

After the second layer is formed, the valve 330*b* is closed and the supply of the $C_3H_6$ gas is stopped. Then, by the same processing procedure as in the surface modification step, the $C_3H_6$ gas unreacted or contributed to the formation of the C-containing layer and the reaction by-product, which remain in the process chamber 201, are removed from the process chamber 201. At this time, as in the surface modification step, the gas and the like remaining in the process chamber 201 may not be completely removed.

As the carbon-containing gas, in addition to the $C_3H_6$ gas, it may be possible to use a hydrocarbon-based gas such as an acetylene ($C_2H_2$) gas, an ethylene ($C_2H_4$) gas or the like.

[Step 3]

($O_2$ Gas Supply)

After step 2 is completed, a thermally activated $O_2$ gas is supplied to the wafers 200 in the process chamber 201.

In this step, the opening/closing control of the valves 330*b* and 330*f* is performed in the same procedure as the opening/closing control of the valves 330*c* and 330*f* in the surface modification step. The $O_2$ gas is supplied into the process chamber 201 through the gas supply pipe 310*b* and the nozzle 340*b* heated to the film-forming temperature. The supply flow rate of the $O_2$ gas controlled by the MFC 241*b* is set to a flow rate falling within a range of, for example, 100 to 10,000 sccm. The pressure in the process chamber 201 is set to a pressure falling within a range of, for example, 1 to 6,000 Pa. The partial pressure of the $O_2$ gas in the process chamber 201 is set to a pressure falling within a range of, for example, 0.01 to 5941 Pa. The time for which the $O_2$ gas is supplied to the wafers 200, that is, the gas supply time (irradiation time) may be set to a time falling within a range of, for example, 1 to 120 seconds, and specifically 1 to 60 seconds. Other processing conditions are, for example, the same as the processing conditions in the surface modification step. The $O_2$ gas is thermally activated under the above conditions.

At this time, neither the HCDS gas nor the $C_3H_6$ gas is allowed to flow into the process chamber 201. Therefore, the $O_2$ gas is supplied to the wafers 200 in an activated state without causing a gas phase reaction. The $O_2$ gas supplied to the wafers 200 reacts with at least a part of the second layer containing Si and C (the layer including the Si-containing layer containing Cl and the C-containing layer), which has been formed on the wafer 200 in step 2. Thus, the second layer is thermally oxidized in a non-plasma manner and converted (modified) into a third layer containing Si, O and C, that is, a silicon oxycarbide layer (SiOC layer). When forming the third layer, impurities such as Cl and the like contained in the second layer constitute a gaseous substance containing at least Cl in the process of the modification reaction caused by the $O_2$ gas. The gaseous substance is discharged from the inside of the process chamber 201. Thus, the third layer contains a smaller amount of impurities such as Cl or the like than the second layer.

At this time, the oxidation reaction of the second layer is not saturated. For example, when the Si-containing layer containing Cl and having a thickness of several atomic layers is formed in step 1, and the C-containing layer having a thickness of less than one atomic layer is formed in step 2, at least a part of the surface layer (one atomic layer of the surface) is oxidized. In this case, in order not to oxidize the entire second layer, the oxidation is performed under the condition that the oxidation reaction of the second layer becomes unsaturated such that the second layer is not entirely oxidized.

At this time, in particular, the above-mentioned processing conditions may be adjusted by increasing a dilution rate of the $O_2$ gas with the $N_2$ gas (reducing the concentration) or shortening the supply time of the $O_2$ gas. Thus, uniformity can be obtained while making the oxidation reaction of the second layer unsaturated. The film-forming sequence of FIG. 4 illustrates an example where the supply flow rate of the $N_2$ gas supplied in step 3 is made higher than the supply flow rate of the $N_2$ gas supplied in other steps, thereby reducing the partial pressure of the $O_2$ gas and decreasing an oxidizing power.

By reducing the oxidizing power in step 3, it becomes easy to suppress desorption of C from the second layer during the oxidation process. Since a bonding gas energy of an Si—O bond is larger than that of an Si—C bond, the Si—C bond tends to be broken when the Si—O bond is formed. Further, by reducing the oxidizing power in step 3, it is possible to maintain the state where Si is exposed on the outermost surface of the third layer, and to easily nitride the outermost surface of the third layer in step 4 described below. That is, when Si capable of bonding with N under the conditions of step 4 described below is allowed to exist on the outermost surface of the third layer, it becomes easy to form an Si—N bond.

(Residual Gas Removal)

After the third layer is formed, the valve 330b is closed and the supply of the $O_2$ gas is stopped. Then, by the same processing procedure as in the surface modification step, the $O_2$ gas unreacted or contributed to the formation of the third layer and the reaction by-product, which remain in the process chamber 201, are removed from the process chamber 201. At this time, as in the surface modification step, the gas and the like remaining in the process chamber 201 may not be completely removed.

As the oxidizing gas, in addition to the $O_2$ gas, it may be possible to use an oxygen-containing gas such as water vapor ($H_2O$), a nitric oxide (NO) gas, a nitrous oxide ($N_2O$) gas, a nitrogen dioxide ($NO_2$) gas, a carbon monoxide (CO) gas, a carbon dioxide ($CO_2$) gas, an ozone ($O_3$) gas, a hydrogen ($H_2$) gas+$O_2$ gas, an $H_2$ gas+$O_3$ gas), or the like.

[Step 4]
($NH_3$ Gas Supply)

After step 3 is completed, a thermally activated $NH_3$ gas is supplied to the wafer s200 in the process chamber 201.

The processing procedure at this time is the same as the processing procedure of the surface modification step described above. The time for which the $NH_3$ gas is supplied to the wafers 200, that is, the gas supply time (irradiation time) may be set to a time falling within a range of, for example, 1 to 120 seconds, and specifically 1 to 60 seconds. Other processing conditions are the same as the processing conditions of the surface modification step described above. The $NH_3$ gas is thermally activated under the conditions described above.

At this time, the gas flowing into the process chamber 201 is the thermally activated $NH_3$ gas. The HCDS gas, the $C_3H_6$ gas and the $O_2$ gas are not allowed to flow into the process chamber 201. Therefore, the $NH_3$ gas reaches the wafers 200 in an activated state without causing a gas phase reaction, and reacts with at least a part of the third layer (SiOC layer) formed on the wafer 200 in step 3. Thus, the third layer is thermally nitrided in a non-plasma manner and converted (modified) into a fourth layer containing Si, O, C and N, that is, a silicon oxycarbonitride layer (SiOCN layer). When forming the fourth layer, impurities such as Cl and the like contained in the third layer form a gaseous substance containing at least Cl in the process of the modification reaction with the $NH_3$ gas. The gaseous substance is discharged from the inside of the process chamber 201. That is, the impurities such as Cl and the like in the third layer are separated from the third layer by being extracted or desorbed from the third layer. Thus, the fourth layer contains a smaller amount of impurities such as Cl and the like than the third layer.

Further, by supplying the activated $NH_3$ gas to the wafers 200, the outermost surface of the third layer is modified in the process of nitriding the third layer. The outermost surface of the third layer subjected to the surface modification process in the nitriding process, that is, the outermost surface of the fourth layer has surface state in which the HCDS is easily adsorbed and Si is easily deposited in the next step 1. That is, the $NH_3$ gas used in step 4 also acts as an adsorption/deposition promoting gas that promotes adsorption and deposition of HCDS or Si on the outermost surface of the fourth layer (the outermost surface of the wafer 200).

At this time, the nitriding reaction of the third layer is not saturated. For example, when the third layer having a thickness of several atomic layers is formed in steps 1 to 3, nitriding is performed under the condition that at least a part of the surface layer (one atomic layer on the surface) is nitrided and the surface layer is not wholly nitrided.

(Residual Gas Removal)

After the fourth layer is formed, the valve 330c is closed and the supply of the $NH_3$ gas is stopped. Then, by the same processing procedure as in the surface modification step, the $NH_3$ gas unreacted or contributed to the formation of the fourth layer and the reaction by-product, which remain in the process chamber 201, are removed from the process chamber 201. At this time, as in the surface modification step, the gas and the like remaining in the process chamber 201 may not be completely removed.

(Performing a Predetermined Number of Times)

By performing a cycle that non-simultaneously performs the steps 1 to 4 described above, one or more times (a predetermined number of times), a SiOCN film having a predetermined composition and a predetermined film thickness can be formed on the wafer 200. The above cycle may be repeated multiple times. That is, it is preferable that the thickness of the SiOCN layer formed per cycle is set to be smaller than the desired film thickness, and the above-described cycle is repeated a plurality of times until the film thickness reaches the desired film thickness.

(Purging and Atmospheric Pressure Restoration)

The valve 330f is opened, and an $N_2$ gas is supplied into the process chamber 201 from the gas supply pipe 310f and exhausted from the exhaust pipe 232. The $N_2$ gas acts as a purge gas. Thus, the inside of the process chamber 201 is purged, and the gas and reaction byproduct remaining in the process chamber 201 are removed from the inside of the process chamber 201 (purging). Thereafter, the atmosphere in the process chamber 201 is replaced with an inert gas (inert gas replacement), and the pressure in the process chamber 201 is returned to the atmospheric pressure (atmospheric pressure restoration).

(Boat Unloading and Wafer Discharging)

The boat elevator 115 lowers the seal cap 219 and opens the lower end of the manifold 226. Then, the processed wafers 200 are unloaded from the lower end of the manifold 226 to the outside of the reaction tube 203 while being supported by the boat 217 (boat unloading). The processed wafers 200 are taken out from the boat 217 (wafer discharging).

(3) Cleaning Process

When the above film-forming process is performed, a deposit including a thin film such as a SiOCN film or the like is accumulated on the inner wall of the reaction tube 203, the surface of the boat 217, and the like. That is, the deposit including the thin film adheres to and accumulates on surfaces of members in the process chamber 201 heated to the film-forming temperature. A cleaning process is performed before the amount (thickness) of the deposit reaches a predetermined amount (thickness) before the deposit is separated or dropped.

The cleaning process is performed by executing a cleaning process in which a deposit including SiOCN and a by-product deposited on the surfaces of the members in the process chamber 201 is removed through a thermochemical reaction by supplying a fluorine-based gas as a cleaning gas from the nozzle 340a heated to a cleaning temperature into the process chamber 201 heated to the cleaning temperature, and supplying a reaction promoting gas as a cleaning gas from the nozzle 340b heated to the cleaning temperature.

Figure 5:
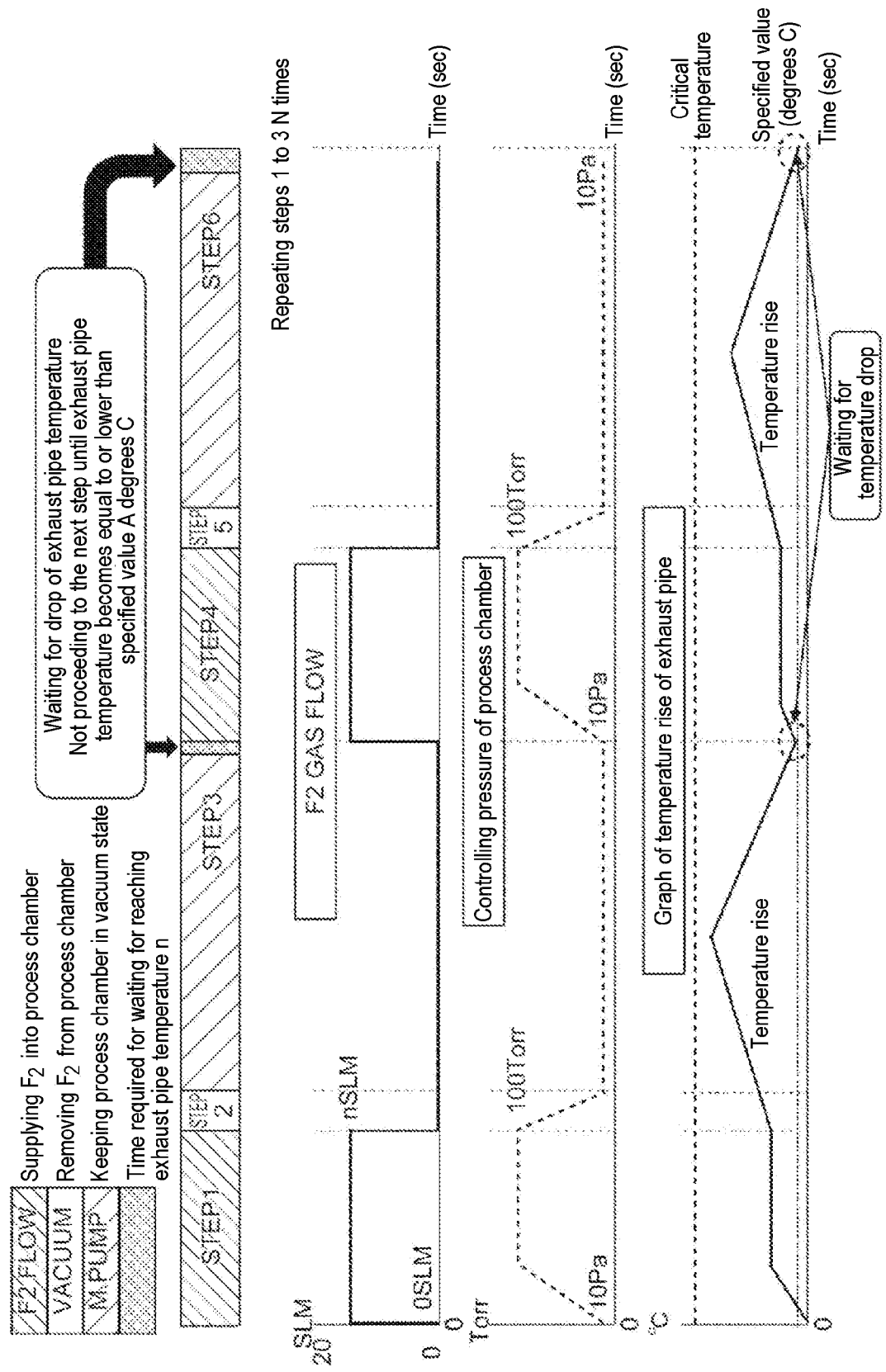
FIG. 5 is a diagram showing a processing timing, a gas supply timing, a reaction chamber pressure and an exhaust pipe temperature in a first cleaning according to an embodiment of the present disclosure.
Figure 6:
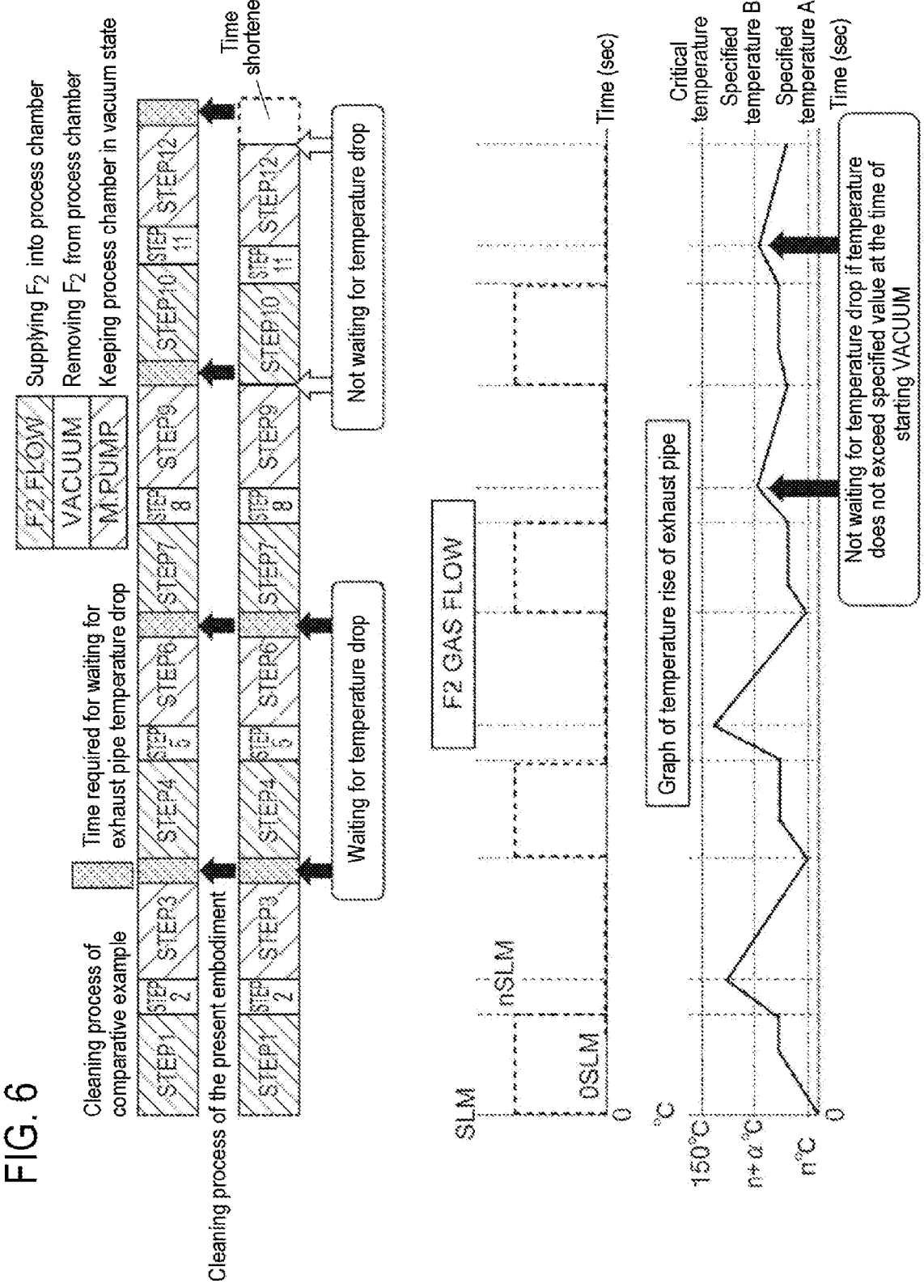
FIG. 6 is a diagram showing a processing timing, a gas supply timing, and an exhaust pipe temperature in a first cleaning according to an embodiment of the present disclosure.

In the cleaning process, an F2FLOW step as a first step of supplying a cleaning gas into the reaction tube 203 and exhausting the cleaning gas with the vacuum pump to maintain a predetermined first pressure, a VACUUM step as a second step of stopping the supply of the cleaning gas and exhausting the cleaning gas and the reaction product of the cleaning gas in the reaction tube 203, and an M.PUMP step as a third step of cooling the exhaust pipe connecting the reaction tube 203 and the vacuum pump while maintaining the pressure inside the reaction tube 203 at a second pressure lower than the first pressure or less, are sequentially and repeatedly performed N times (see FIG. 5).

Hereinafter, an example of the cleaning process will be described.

In the following description, operations of the respective parts of the substrate processing apparatus are controlled by the controller 280.

(Boat Loading)

The empty boat 217, i.e., the boat 217 not loaded with the wafers 200, is lifted by the boat elevator 115 and loaded into the process chamber 201. In this state, the seal cap 219 seals the lower end of the manifold 226 via the O-ring 220b.

(Vacuum-Evacuation and Temperature Adjustment)

The inside of the process chamber 201 is vacuum-evacuated by the vacuum pump 246 to have a predetermined pressure or less (e.g., 10 Pa). Further, the inside of the process chamber 201 is heated by the heater 207 to reach a specified temperature C. By heating the inside of the process chamber 201 to the specified temperature C, the inner wall of the reaction tube 203, the surfaces and insides (inner walls) of the nozzles 340a to 340c, the surface of the boat 217, and the like are heated to the specified temperature C. When the temperature in the process chamber 201 reaches the specified temperature C, the specified temperature C is maintained until the cleaning process is completed. Then, rotation of the boat 217 by the boat rotation mechanism 267 is started. The rotation of the boat 217 is continuously performed until the cleaning process is completed. However, the boat 217 may not be rotated.

(Cleaning Process)

Thereafter, as shown in FIG. 5, the following three steps, that is, the F2FLOW step, the VACUUM step and the M.PUMP process are sequentially executed. As will be described later, time required for the F2FLOW step and the VACUUM step is fixed except during an emergency such as an emergency stop or the like, but time required for the M.PUMP step may be extended by an additional waiting time.

[F2FLOW Step]

In the F2FLOW step, an $F_2$ gas is introduced into the process chamber 201 from the nozzle 340a by opening the valve 330d. Further, an NO gas may be introduced from the heated nozzle 340b by opening the valve 330e. At this time, as shown in the upper graph of FIG. 5, the MFCs 241d and 241e are controlled such that the gases are introduced at a predetermined flow rate (e.g., 10 slm). Further, the APC valve 244 is appropriately adjusted to maintain the pressure inside the process chamber 201 at a first cleaning pressure, for example, 100 Torr.

At this time, the $N_2$ gas may be caused to flow from the gas supply pipe 310f or the like to dilute the $F_2$ gas and the NO gas, respectively. All the nozzles may be constantly supplied with a minimum amount (e.g., 1 sccm) of $N_2$ gas to keep the inside of the gas supply pipe clean or protect the same. The flow rate of the $N_2$ gas depends on the flow rates of other gases flowing together from the same supply pipe, thereby preventing a backflow. The flow rate of the $N_2$ gas from the nozzle is controlled to be constant, and is, for example, 1 slm or less in total. Separately from this, a shaft purge gas that protects the rotation shaft 265 and prevents adhesion of a by-product to the low temperature portion may be supplied at a predetermined flow rate (e.g., 1 slm or less) and introduced into the process chamber 201. At the beginning of the F2FLOW step, the pressure is below a target value and, therefore, the APC valve 244 may be fully closed. When the pressure inside the process chamber 201 reaches 100 Torr, the APC valve 244 performs pressure control while changing its opening degree. As a result, the pressure is changed as shown in the middle graph of FIG. 5.

When the cleaning gas passes through the process chamber 201 and is exhausted from the exhaust pipe 232, the cleaning gas makes contact with the members inside the process chamber 201, for example, the inner wall of the reaction tube 203, the surfaces of the nozzles 340a to 340c, the surface of the boat 217, and the like. Then, the cleaning gas and the deposit chemically react with each other. The deposit is vaporized and removed by being changed to a substance (product gas) having a low vapor pressure. Through this reaction, q total number of moles of a gas can be increased, for example, as in the reaction described below.

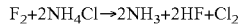
$$F_2+2NH_4Cl \rightarrow 2NH_3+2HF+Cl_2$$

The reaction caused by this cleaning gas is usually an exothermic reaction, and a mixture of the unreacted cleaning gas, the $N_2$ gas and the product gas flowing into the exhaust pipe 232 has a high temperature. The temperature of the exhaust pipe 232 on the upstream side of the APC valve 244 (on the side of the process chamber 201) is shown in the lower graph of FIG. 5. The temperature of the exhaust pipe 232 increases in conjunction with the increase in pressure due to the introduction of the cleaning gas.

[VACUUM Step]

When a preset gas supply time has elapsed from the start of the F2FLOW step, the valves 330d and 330e are closed to terminate the F2FLOW step and start the VACUUM step. In the VACUUM step, the supply of the cleaning gas into the process chamber 201 is stopped, the APC valve 244 is kept in an open state, and the cleaning gas or the like in the process chamber 201 is exhausted through the exhaust pipe 232. As shown in FIG. 5, the pressure inside the process chamber 201 is controlled by the APC valve 244 to gradually decrease at a predetermined rate (e.g., −2000 Pa/s). The VACUUM step is completed at a fixed time because the pressure is reduced from a predetermined pressure (100 Torr) at a predetermined rate. Alternatively, it is possible to give extension to time to reach 10 Pa such that the low pressure is maintained for a predetermined time.

In the VACUUM step, the gas supply pipe 310f or the like may be opened to supply the $N_2$ gas into the process chamber 201 at a predetermined flow rate, for example, at the same flow rate as in the F2FLOW step. Execution time of the VACUUM step may be determined by a criterion that causes a suitable gas flow or pressure fluctuation in the process chamber 201. In this step, a pressure change rate is higher than that in the F2FLOW step. Therefore, a strong flow toward the exhaust port 230 is generated in almost the entire process chamber 201. Diffusion is promoted by this convection (advection), and the cleaning reaction is easier to spread to every corner. It is known that diffusion (dispersion) is greatly promoted when a gas flows in the process chamber 201 under a condition that a velocity gradient (vortex) or a turbulent flow is generated.

If a pressure reduction rate is too high, the cleaning time is shortened, whereby the cleaning effect may be rather reduced and particles may be generated. The thickness of the deposit layer to be cleaned is not necessarily uniform in the process chamber 201, and may be uneven depending on the chemical reaction and the substance transport conditions (Reynolds number and the like) when the deposit layer is deposited. Accordingly, a gas flow velocity distribution may be formed to reproduce the same etching unevenness as unevenness at the deposition. The flow rate of the $N_2$ gas may be set for that purpose.

When the F2FLOW step and the VACUUM step described above are performed, the cleaning gas or the like supplied into the process chamber 201 flows into the exhaust pipe 232 in a concentrated manner, and the cleaning gas of a high concentration flows through the exhaust pipe 232 at a high flow rate. The temperature of the exhaust pipe 232 rises as shown in FIG. 5 because the exhaust pipe 232 is exposed to a higher temperature gas due to the intense cleaning reaction and because the cleaning reaction also occurs intensely on the inner surface of the exhaust pipe 232. When the temperature of the exhaust pipe 232 rises to a temperature, for example, higher than 200 degrees C., even in a case where the exhaust pipe 232 is made of, for example, an alloy having excellent heat resistance and corrosion resistance such as Hastelloy (registered trademark) or the like, the exhaust pipe 232 may be corroded and may be damaged. Alternatively, a seal member that seals a joint of the exhaust pipe 232 may be deteriorated. Therefore, a critical temperature may be set to perform an operation such that the critical temperature is not exceeded. The pressure reduction rate of the F2FLOW step is also limited in this respect.

[M.PUMP Step]

When the VACUUM step is completed, in the M.PUMP process, the exposure of the cleaning gas and the reaction by-product to the exhaust pipe 232 is made less than that in the F2FLOW step and the VACUUM step while maintaining the pressure inside the reaction pipe 203 at a second pressure lower than the first pressure or less. Thus, the exhaust pipe 232 heated in the VACUUM step and the M.PUMP step is cooled (natural cooling). For example, the APC valve 244 is fully opened and the inside of the reaction tube 203 is maintained at an ultimate pressure or a pressure of 10 Pa or less. At this time, the valve 330f or the like is closed or the MFC 241f is controlled to stop the supply of the $N_2$ gas into the exhaust pipe 232 or limit the supply of the $N_2$ gas such that the ultimate pressure does not increase excessively. A modest amount of $N_2$ gas helps reduce the partial pressure of the reaction product to below a parallel vapor pressure.

The temperature of the exhaust pipe 232 may rise for a while even after entering the M.PUMP step because of the delay in heat transfer. However, the temperature of the exhaust pipe 232 begins to drop soon. The M.PUMP step is continued for at least a predetermined time while measuring the temperature of the exhaust pipe 232 by the temperature sensor 231a. In a case where the highest temperature measured in the M.PUMP step at that time is equal to or lower than a specified temperature B, the M.PUMP step is terminated and the process proceeds to the F2FLOW step of the next cycle. In a case where the highest temperature exceeds the specified temperature B, the M.PUMP step is continued until the temperature of the exhaust pipe 232 drops to below a specified temperature A.

The specified temperature A (first temperature) is a temperature between a normal temperature (room temperature) and a critical temperature (a temperature at which the exhaust pipe 232 undergoes corrosion), and is set to a temperature which is set the critical temperature is not exceeded even when the F2FLOW step and the VACUUM step of the second and subsequent cycles are started from that temperature. The specified temperature A is appropriately determined according to various conditions such as the material, structure, heat capacity and heat radiation efficiency of the exhaust pipe 232, the type and flow rate of the cleaning gas, the processing temperature, and the like. When the above-mentioned critical temperature is 200 degrees C., the specified temperature A may be set to a temperature falling within a range of, for example, 60 degrees C. to 90 degrees C.

When the cycle including the F2FLOW step, the VACUUM step and the M.PUMP step is sequentially repeated, the byproduct is removed and the chemical reaction is decreased, whereby the temperature rise in the exhaust pipe decreases. Accordingly, the temperature does not exceed the critical temperature without waiting for the temperature to drop to the specified temperature A (see FIG. 6). The waiting for the temperature to drop at this time would be a waste of time.

Therefore, in the present embodiment, when the temperature is equal to or lower than the specified temperature B during the M.PUMP step, the M.PUMP step is terminated without waiting for the temperature decrease.

Figure 7:
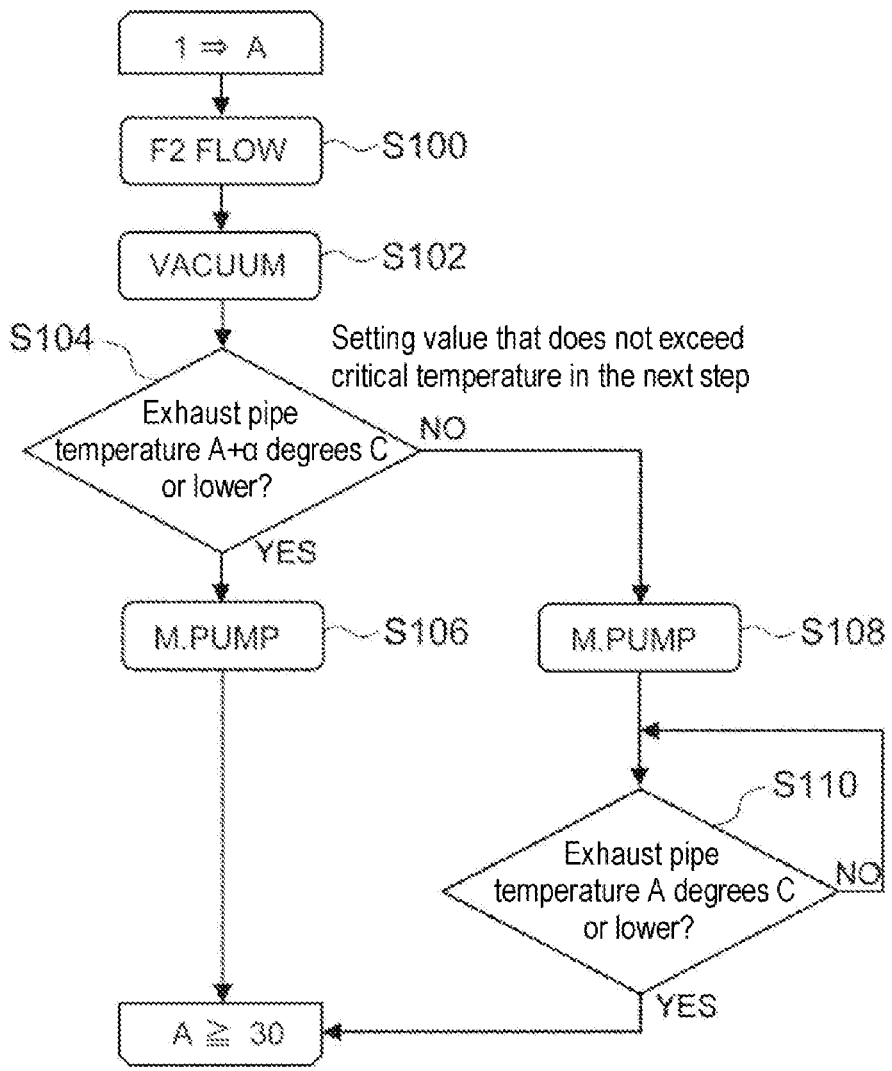
FIG. 7 is a flowchart showing a logic of a cleaning process according to an embodiment of the present disclosure.

For example, the specified temperature B (second temperature) may be set to be higher than the specified temperature A by a predetermined temperature a. The specified temperature B is appropriately determined in accordance with various conditions such as the material, structure, heat capacity, heat dissipation efficiency of the exhaust pipe 232, the type and flow rate of the cleaning gas, the processing temperature and the like, and is determined so as not to exceed the critical temperature in the next F2FLOW step and VACUUM step. Furthermore, the temperature of the exhaust pipe 232 to be compared with the specified temperature B may be measured once at the beginning of (immediately before) the M.PUMP step as shown in FIG. 7, or may be measured throughout the cycle.

In the M.PUMP step, the valve 330f may be opened to allow the $N_2$ gas to flow into the exhaust pipe 232. In this case, the $N_2$ gas acts as a cooling gas (cooling medium), and may accelerate the cooling of the exhaust pipe 232. At this time, the $N_2$ gas may be directly supplied into the exhaust pipe 232. In this case, for example, a port configured to supply the $N_2$ gas may be provided on the upstream side of the exhaust pipe 232, a supply pipe configured to supply the $N_2$ gas may be connected to the port, and the $N_2$ gas may be supplied into the exhaust pipe 232 via this supply pipe and the port. By directly supplying the $N_2$ gas into the exhaust pipe 232 without going through the high-temperature process chamber 201, it is possible to further promote the cooling of the exhaust pipe 232.

[Performing a Predetermined Number of Times]

Thereafter, the F2FLOW step, the VACUUM step and the M.PUMP step are sequentially repeated a predetermined number of times to perform the cleaning process. By alternately repeating the F2FLOW step, the VACUUM step and the M.PUMP step, it is possible to properly perform the above-described deposit removal process while maintaining the temperature of the exhaust pipe 232 below the critical temperature.

As an example, the processes of steps S100 to S110 are sequentially repeated a predetermined number of times (e.g., 30 times) as in the flowchart shown in FIG. 7.

First, the F2FLOW step is performed in step S100. Then, the VACUUM step is performed in step S102. When the VACUUM step is completed, it is determined in step S104 whether the temperature of the exhaust pipe 232 measured by the temperature sensor 231a is equal to or lower than the specified temperature B.

When the temperature of the exhaust pipe 232 measured by the temperature sensor 231a is equal to or lower than the specified temperature B, in step S106, the M.PUMP step is completed at a predetermined time. The process returns to step S100 and goes to the next F2FLOW step. A temperature rise width of the exhaust pipe 232 in the VACUUM step monotonically decreases depending on the number of repetitions of the cycle. Therefore, once branched to step S106, it is expected to be branched to step S106 in the subsequent cycles, whereby each of the cycles is repeated in a fixed time pattern.

On the other hand, in step S104, when the temperature of the exhaust pipe 232 measured by the temperature sensor 231a is higher than the specified temperature B, the M.PUMP step is performed for a predetermined time in step S108. Thereafter, in step S110, after waiting until the temperature of the exhaust pipe 232 measured by the temperature sensor 231a becomes equal to or lower than the specified temperature A, the process returns to step S100 and proceeds to the next F2FLOW step. The waiting in step S110 is performed while continuing the M.PUMP step started in step S108.

(4) Modification of Cleaning Process

The cleaning process in the present embodiment is not limited to the above-mentioned aspect, and may be modified as in the following modifications.

(Modification 1)

When the F2FLOW step is performed, the pressure in the process chamber 201 may be changed by intermittently supplying the $N_2$ gas into the process chamber 201 while continuously supplying the $F_2$ gas and the NO gas into the process chamber 201. That is, in the F2FLOW step, the valves 330d and 330e may be kept open, and at this time, the opening/closing operation of at least one of the valves 330d and 330e may be repeated. Also in this case, it is possible to improve an efficiency of removing the deposit from the inside of the process chamber 201.

(Modification 2)

When performing the F2FLOW step, it may be possible to perform a step of supplying and containing the $F_2$ gas and the NO gas into the process chamber 201 and a step of maintaining the state in which the $F_2$ gas and the NO gas are contained in the process chamber 201.

Furthermore, by supplying and confining the $F_2$ gas and the NO gas into the process chamber 201, it becomes possible to prevent the $F_2$ gas and the NO gas from being discharged from the process chamber 201 without contributing to the cleaning. The surface chemical reaction at this time is rate-limited to diffusion. If time is taken, the $F_2$ gas and the NO gas are spread over the entire area of the process chamber 201, which makes it easy to perform cleaning with little unevenness. Furthermore, the APC valve 244 is substantially closed while maintaining the state in which the cleaning gas is contained in the process chamber 201. Therefore, it is possible to cool the exhaust pipe 232.

When the opening of the APC valve 244 is controlled in the cleaning process, the opening degree may increase or decrease (oscillate) depending on the characteristics of the PID control. However, there is a secondary effect of changing the gas flow and promoting the substance movement. Alternatively, the vibration may be intentionally increased, or the APC valve 244 may be controlled to alternately repeat a full closing operation and a full opening operation. Further, the APC valve 244 may be opened slightly even when the pressure is lower than a target value and the APC valve 244 is to be fully closed, thereby reducing wearing of the valve.

(5) Effects of the Present Embodiment

According to the present embodiment, one or more of the following effects may be obtained.

(a) In the cleaning process, when the temperature of the exhaust pipe at the transition from the VACUUM step to the M.PUMP step is higher than the specified temperature B higher than the specified temperature A, the cooling is continued until the temperature of the exhaust pipe becomes the specified temperature A or lower. When the temperature of the exhaust pipe is equal to or lower than the specified temperature B, the cooling of the exhaust pipe is completed at a predetermined time without continuing the cooling until the temperature of the exhaust pipe becomes equal to or lower than the specified temperature A. Therefore, it is possible to shorten the time for which the cooling of the exhaust pipe is waited. The specified temperature A is not limited to a single set value, and a plurality of set values may be used according to the progress (the number of repetitions) of the cleaning process.

(b) In the cleaning process, the F2FLOW step and the VACUUM step of cleaning the inside of the process chamber 201 and the M.PUMP step of cooling the exhaust pipe 232 are sequentially repeated. Thus, a treatment process or the cleaning process can be appropriately performed while maintaining the temperature of the exhaust pipe 232 at a temperature equal to or lower than the specified temperature B, that is, the temperature below a critical temperature.

(c) As described above, when a gas such as HCDS gas or the like having a large number of Cl contained in one molecule is used as the precursor gas, a reaction by-product such as $NH_4Cl$ is easily generated, and the amount of the reaction by-product deposited inside the exhaust pipe 232 tends to increase. Further, even when the exhaust pipe 232 is configured as a pipe such as a bellows pipe, having an uneven structure on an inner wall thereof, the amount of reaction by-product adhering to the inside of the exhaust pipe 232 tends to increase. Therefore, in these cases, the temperature of the exhaust pipe 232 is easily increased by performing the cleaning process. The present embodiment in which the M.PUMP step is performed at the above-described timing has great significance in such cases.

(d) By merely changing the cleaning recipe so that the M.PUMP step is performed at the above-described timing, the effects described above may be obtained. That is, in the present embodiment, it is not necessary to make the configuration of the exhaust system of the substrate processing apparatus complicated by, for example, separately providing a cooling device such as a chiller unit or the like configured to cool the exhaust pipe 232. Therefore, it is possible to avoid an increase in a manufacturing cost, a remodeling cost and a maintenance cost of the substrate processing apparatus. Further, the electric power to operate the cooling device is also unnecessary. Therefore, it is possible to avoid an increase in the electric power consumption of the substrate processing apparatus, i.e., an operating cost.

(e) In the M.PUMP step, the $N_2$ gas as a cooling gas is supplied into the exhaust pipe 232 to forcibly cool the exhaust pipe 232. This makes it possible to improve the cooling efficiency of the exhaust pipe 232 and to shorten the execution time of the M.PUMP step. As a result, the time required for the cleaning process, that is, downtime of the substrate processing apparatus can be shortened to improve the productivity of the substrate processing apparatus.

(f) By sequentially repeating the F2FLOW step, the VACUUM step and the M.PUMP step to repeatedly change the pressure in the process chamber 201, it is possible to increase the efficiency of removing the deposit from the inside of the process chamber 201. As a result, the time required for the cleaning process, that is, the downtime of the substrate processing apparatus can be shortened to improve the productivity of the substrate processing apparatus.

(g) In the cleaning process, by using the $F_2$ gas and the NO gas, that is, by using the mixed gas obtained by adding the NO gas to the $F_2$ gas, it is possible to increase the etching rate of the deposit and to efficiently carry out the cleaning of the inside of the process chamber 201. In addition, by using the $F_2$ gas and NO gas in the cleaning process, even when the processing conditions such as the temperature (cleaning temperature) in the process chamber 201 are set to the conditions on the low temperature side, it is possible to perform the cleaning in the process chamber 201 at a practical speed. As a result, it is possible to suppress the etching damage to the quartz member in the process chamber 201 and to more reliably avoid the corrosion of the exhaust pipe 232.

Other Embodiments of the Present Disclosure

The embodiments of the present disclosure have been specifically described above. However, the present disclosure is not limited to the above-described embodiments, and various modifications may be made without departing from the spirit of the present disclosure.

For example, the exhaust pipe 232 may be provided with a sub-heater (jacket heater) as a heating mechanism. By heating the exhaust pipe 232 with the sub-heater when performing the above-described film-forming process, it becomes possible to suppress adhesion of the reaction by-product to the inside of the exhaust pipe 232. However, even when the exhaust pipe 232 is heated by the sub-heater when performing the film-forming process, it is difficult to completely prevent the reaction by-product from adhering to the inside of the exhaust pipe 232. Thus, the problem described above may occur during the cleaning process. The exhaust pipe 232 is not heated by the sub-heater when performing the cleaning process described above.

Further, for example, in the above-described embodiments, there has been described the example in which the $F_2$ gas as a fluorine-based gas and the NO gas as a reaction promoting gas are used in combination as the cleaning gas. However, the present disclosure is limited thereto. That is, as the cleaning gas, a fluorine-based gas such as an $F_2$ gas, a chlorine trifluoride ($ClF_3$) gas, a nitrogen trifluoride ($NF_3$) gas or a hydrogen fluoride (HF) gas may be used alone, or a gas obtained by mixing the above gases in any combination may be used. In addition, as the reaction promoting gas, it may be possible to use an $H_2$ gas, an $O_2$ gas or an $NH_3$ gas. Further, other nitrogen oxide gases such as an $N_2O$ gas, an $NO_2$ gas or the like may be used as the reaction promoting gas.

Further, for example, in the above-described embodiments, there has been described the example in which the SiOCN film is formed on the wafer 200 by the film-forming sequence shown in FIG. 4, that is, the film-forming sequence denoted below, and then the inside of the process chamber 201 is cleaned.

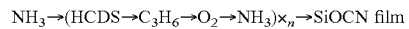

However, the present disclosure is not limited to the aspects described above. That is, the cleaning process described above may be suitably implemented even after silicon-based insulating films such as a SiOCN film, a silicon carbonitride film (SiCN film), a silicon oxynitride film (SiON film), a silicon nitride film (SiN film), a silicon borocarbonitride film (SiBCN film), a silicon boronitride film (SiBN film) and the like are formed on the wafer by the film-forming sequences denoted below.

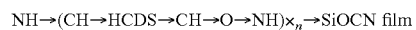

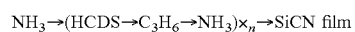

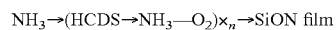

$NH_3 \rightarrow (HCDS \rightarrow NH_3) \times_n \rightarrow SiN$ film $NH_3 \rightarrow (HCDS \rightarrow C_3H_6 \rightarrow BCl_3 \rightarrow NH_3) \times_n \rightarrow SiBCN$ film $NH_3 \rightarrow (HCDS \rightarrow BCl_3 \rightarrow NH_3) \times_n \rightarrow SiBN$ film The processing procedure and processing conditions in each step of these film-forming sequences may be, for example, the same as the processing procedures and processing conditions in the above-described embodiments. In the step of supplying the $BCl_3$ gas to the wafer 200, the $BCl_3$ gas is allowed to flow from the gas supply pipe 310b. Further, the supply flow rate of the $BCl_3$ gas controlled by the MFC 241b is set to a flow rate falling within a range of, for example, 100 to 10000 sccm. Other processing conditions are, for example, the same as those in step 2 of the film-forming sequence shown in FIG. 4.

A process recipe (a program in which the processing procedures and processing conditions of the film-forming process are described) used when forming these various thin films, and a cleaning recipe (a program in which the processing procedures and processing conditions of the cleaning process are described) used when removing a deposit including these various thin films may be individually provided (in a plural number) according to the contents (a type of the thin film to be formed or removed, a composition ratio, a film quality, a film thickness, and the like) of the film-forming process and the cleaning process. When starting the substrate processing process, an appropriate recipe may be selected from a plurality of recipes according to the contents of the substrate processing process. Specifically, a plurality of recipes individually provided according to the contents of the substrate processing process may be stored (installed) in advance in the memory device 121c included in the substrate processing apparatus via an electric communication line or a recording medium (external memory device 123) in which the recipes are stored. Then, when starting the film-forming process or the cleaning process, the CPU 121a included in the substrate processing apparatus may select an appropriate recipe from the plurality of recipes stored in the memory device 121c according to the contents of the substrate processing process. With such a configuration, it becomes possible to form thin films of various film types, composition ratios, film qualities and film thicknesses in a versatile and reproducible manner through the use of one substrate processing apparatus or remove the thin films. In addition, it is possible to reduce an operator's operation burden (for example, burden of inputting processing procedures, processing conditions, and the like), and to quickly start the substrate processing process while avoiding an operation error.

In the embodiments described above, there has been described the example in which the thin film is formed by using the batch-type substrate processing apparatus that processes a plurality of substrates at a time. The present disclosure is not limited to the embodiments described above, and may be suitably applied to, for example, a case where a thin film is formed by using a single-substrate-type processing apparatus that processes one or several substrates at a time. Further, in the embodiments described above, there has been described the example in which the thin film is formed by the substrate processing apparatus including the hot wall type process furnace. The present disclosure is not limited to the embodiments described above, and may be suitably applied to a case where a thin film is formed by using a substrate processing apparatus including a cold wall type process furnace. Also in these cases, the processing conditions may be, for example, the same as the processing conditions of the embodiments described above.

Further, the embodiments and modifications described above may be appropriately combined and used. Further, the processing conditions at this time may be, for example, the same as the processing conditions of the embodiments described above.

According to the embodiments of the present disclosure, it is possible to improve a manufacturing throughput of an electronic device or the like.

The disclosure of Japanese Patent Application No. 2018-031234 is incorporated herein by reference in its entirety.

All documents, patent applications and technical standards mentioned herein are incorporated herein by reference to the same extent as when the individual documents, patent applications and technical standards are specifically and individually described to be incorporated herein.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cleaning method, comprising:
   removing a deposit adhering to an inside of a process container by supplying a cleaning gas into the process container after performing a process of forming a film on a substrate in the process container,
   wherein the removing the deposit includes repeatedly performing a cycle including:
      a first process of supplying the cleaning gas into the process container until a predetermined first pressure is reached in the process container;
      a second process of stopping the supplying the cleaning gas and exhausting the cleaning gas and a reaction product generated by the cleaning gas remaining in the process container; and
      a third process of cooling an exhaust pipe connected to the process container, while maintaining a pressure inside the process container at a second pressure, which is lower than the predetermined first pressure,
   wherein, for each cycle, a temperature of the exhaust pipe is detected,
   wherein, for each cycle, a duration of the third process is determined based on the detected temperature in a manner that:
      if the detected temperature is higher than a second temperature that is higher than a first temperature, the duration is extended until the temperature of the exhaust pipe becomes equal to or lower than the first temperature; and
      if the detected temperature is not higher than the second temperature, the duration is set to a predetermined time, and
   wherein the first process includes an operation of exhausting the cleaning gas to maintain the predetermined first pressure while continuing to supply the cleaning gas.

2. The cleaning method of claim 1, wherein a first duration of the third process in a first one of the repeated cycle is longer than a second duration of the third process in a second one of the repeated cycle after the first cycle, and wherein the first one of the repeated cycle starts in a state in which the temperature of the exhaust pipe is equal to or lower than the first temperature and the second one of the repeated cycle starts in a state in which the temperature of the exhaust pipe is higher than the first temperature.

3. The cleaning method of claim 1, wherein in the operation of exhausting the cleaning gas, the cleaning gas is exhausted using a vacuum pump to maintain the predetermined first pressure while continuing to supply the cleaning gas at a constant flow rate,
wherein the third process measures the temperature of the exhaust pipe by using a temperature detector installed at the exhaust pipe,
wherein the first process and the third process perform a pressure adjustment by using a pressure regulator installed at the exhaust pipe,
wherein the first process supplies the cleaning gas with a gas supplier connected to a gas supply system and configured to supply the cleaning gas inside the process container, and
wherein the process container includes:
a cylindrical portion having a closed upper end portion and an opened lower end portion; and
a gas exhaust area formed outside a side wall of the cylindrical portion and connected to an exhaust system configured to exhaust an atmosphere in the process container.

4. The cleaning method of claim 1, wherein the third process includes:
determining whether the temperature of the exhaust pipe detected during the third process and/or the second process immediately prior to the third process is equal to or lower than the second temperature;
in response to determining that the temperature of the exhaust pipe is higher than the second temperature, performing the cooling the exhaust pipe until the temperature of the exhaust pipe becomes equal to or lower than the first temperature; and
in response to determining that the temperature of the exhaust pipe is equal to or lower than the second temperature, performing the cooling the exhaust pipe and terminating the cooling the exhaust pipe before the temperature of the exhaust pipe becomes the first temperature.

5. The cleaning method of claim 1, wherein the third process includes:
determining whether a highest temperature of the exhaust pipe detected during the third process is equal to or lower than the second temperature.

6. The cleaning method of claim 1, wherein the process container includes:
a cylindrical portion having a closed upper end portion and an opened lower end portion; and
a gas exhaust area formed outside a side wall of the cylindrical portion and connected to an exhaust system configured to exhaust an atmosphere in the process container.

7. The cleaning method of claim 1, wherein the second temperature is a temperature lower than a temperature at which the exhaust pipe is corroded.

8. The cleaning method of claim 1, wherein the cleaning gas is a mixed gas of a fluorine-based gas and a reaction promoting gas, and
wherein the deposit is a silicon oxycarbonitride film.

9. The cleaning method of claim 1, wherein the cleaning gas is a mixed gas of a fluorine gas and a nitric oxide gas, and
wherein the deposit is a silicon oxycarbonitride film.

10. The cleaning method of claim 1, wherein the second process raises the temperature of the exhaust pipe after stopping supplying the cleaning gas into the process container.

11. The cleaning method of claim 1, wherein the third process raises the temperature of the exhaust pipe higher than a temperature at a transition from the second process to the third process.

12. The cleaning method of claim 1, wherein in the removing the deposit, the cycle is repeated 30 times.

13. A method of manufacturing a semiconductor device comprising:
performing the cleaning method of claim 1; and
forming a film on a substrate in the process container.

14. A non-transitory computer-readable recording medium storing a program that causes, by a computer, a substrate processing apparatus to perform the cleaning method of claim 1.

15. The cleaning method of claim 7, wherein in the third process, the exhaust pipe is naturally cooled, or the exhaust pipe is forcibly cooled by supplying an inert gas into the exhaust pipe.

* * * * *